US012720896B2

(12) United States Patent
Park et al.

(10) Patent No.: US 12,720,896 B2
(45) **Date of Patent: *Aug. 25, 2026**

(54) IMAGE SENSOR

(71) Applicant: SAMSUNG ELECTRONICS CO., LTD., Suwon-si (KR)

(72) Inventors: Inyong Park, Seongnam-si (KR); Minkwan Kim, Hwaseong-si (KR); In Sung Joe, Seoul (KR); Jinhyung Kim, Hwaseong-si (KR); Dhami Park, Suwon-si (KR); Kisang Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/010,760

(22) Filed: Jan. 6, 2025

(65) Prior Publication Data

US 2025/0142996 A1 May 1, 2025

Related U.S. Application Data

(63) Continuation of application No. 17/490,761, filed on Sep. 30, 2021, now Pat. No. 12,211,873.

(30) Foreign Application Priority Data

Nov. 5, 2020 (KR) ........................ 10-2020-0146667

(51) Int. Cl.
*H10F 39/00* (2025.01)
*H04N 23/10* (2023.01)
(Continued)

(52) U.S. Cl.
CPC ......... *H10F 39/8063* (2025.01); *H04N 23/55* (2023.01); *H04N 23/67* (2023.01);
(Continued)

(58) Field of Classification Search
CPC ........ H04N 23/54; H04N 23/55; H04N 23/10; H04N 23/67; H04N 23/672; H04N 25/11;
(Continued)

(56) References Cited

U.S. PATENT DOCUMENTS 8,102,460 B2 1/2012 Awazu
8,446,498 B2 5/2013 Ishiwata et al.
(Continued)

FOREIGN PATENT DOCUMENTS

CN 109273469 A 1/2019
JP 6780503 B2 11/2020
(Continued)

*Primary Examiner* — Twyler L Haskins
*Assistant Examiner* — Akshay Trehan
(74) *Attorney, Agent, or Firm* — Wolf, Greenfield & Sacks, P.C.

(57) ABSTRACT

An image sensor includes a first substrate including a focus pixel region and pixel regions around the focus pixel region, each of the focus pixel region and the pixel regions including at least one photoelectric conversion region, color filters provided on the focus pixel region and the pixel regions, respectively, and on a first surface of the first substrate, and micro lenses provided on the color filters, respectively. The micro lenses include an auto-focus lens on the focus pixel region, a first micro lens adjacent to the auto-focus lens, and a standard micro lens spaced apart from the auto-focus lens.

16 Claims, 14 Drawing Sheets

(51) Int. Cl.

| | |
|---|---|
| ***H04N 23/55*** | (2023.01) |
| ***H04N 23/67*** | (2023.01) |
| ***H04N 25/11*** | (2023.01) |
| ***H04N 25/79*** | (2023.01) |
| ***H10F 39/18*** | (2025.01) |
| ***H10W 72/90*** | (2026.01) |
| ***H10W 90/00*** | (2026.01) |

(52) U.S. Cl.
CPC ............. *H04N 25/11* (2023.01); *H04N 25/79* (2023.01); *H10F 39/182* (2025.01); *H10F 39/803* (2025.01); *H10F 39/8037* (2025.01); *H10F 39/8053* (2025.01); *H10F 39/807* (2025.01); *H10F 39/809* (2025.01); *H10F 39/811* (2025.01); *H10W 72/90* (2026.01); *H10W 90/00* (2026.01); *H04N 23/10* (2023.01)

(58) Field of Classification Search
CPC .. H04N 25/134; H04N 25/79; H10F 39/8063; H10F 39/182; H10F 39/803; H10F 39/8037; H10F 39/8053; H10F 39/807; H10F 39/809; H10F 39/811; H10W 72/90; H10W 90/00
See application file for complete search history.

(56) References Cited

U.S. PATENT DOCUMENTS

| | | | | |
|---|---|---|---|---|
| 9,420,164 | B1 | 8/2016 | Galor Gluskin et al. | |
| 10,044,959 | B2 | 8/2018 | Galor Gluskin | |
| 10,284,799 | B2 | 5/2019 | Yokogawa et al. | |
| 10,651,226 | B2 | 5/2020 | Lee et al. | |
| 2009/0244347 | A1* | 10/2009 | Vaillant | H10F 39/024 438/69 |
| 2012/0104525 | A1* | 5/2012 | Wu | G02B 3/0018 257/E31.127 |
| 2014/0267848 | A1* | 9/2014 | Wu | G02B 27/123 348/277 |
| 2015/0062390 | A1 | 3/2015 | Kim et al. | |
| 2015/0236066 | A1 | 8/2015 | Tayanaka | |
| 2018/0026065 | A1* | 1/2018 | Hsieh | H10F 39/8063 257/432 |
| 2018/0358396 | A1 | 12/2018 | Huang et al. | |
| 2019/0199950 | A1* | 6/2019 | Yokogawa | G02B 7/34 |
| 2019/0238773 | A1 | 8/2019 | Tsuzuki et al. | |
| 2019/0394389 | A1* | 12/2019 | Lu | H10F 39/8053 |
| 2021/0143200 | A1* | 5/2021 | Cho | H10F 39/182 |

FOREIGN PATENT DOCUMENTS

| | | | |
|---|---|---|---|
| KR | 20180059478 | A | 6/2018 |
| KR | 20180081203 | A | 7/2018 |
| WO | 2020/012860 | A1 | 1/2020 |

* cited by examiner

100a
GR2
SML
HE3
CF
PD
PX
GR1
HE4
ML2
ED2
CR
HE1
AFL
RP
APS
TR
ML4
II'
II
530
500
300
400
200
100
D3
D1

IMAGE SENSOR

CROSS-REFERENCE TO RELATED APPLICATIONS

This application is a continuation of U.S. application Ser. No. 17/490,761, filed on Sep. 30, 2021, which claims priority under 35 U.S.C. § 119 to Korean Patent Application No. 10-2020-0146667, filed on Nov. 5, 2020, in the Korean Intellectual Property Office, the entire contents of which are incorporated by reference herein.

BACKGROUND

The present disclosure relates to an image sensor, and in particular, to a micro lens of an image sensor.

An image sensor is a device that converts an optical image to electrical signals. The image sensor is classified into two types: a charge coupled device (CCD) type and a complementary metal-oxide-semiconductor (CMOS) type. The CMOS-type image sensor is called CIS for short. The CIS includes a plurality of pixels which are two-dimensionally arranged. Each of the unit pixel regions includes a photodiode, which is used to convert an incident light to an electric signal.

SUMMARY

One or more example embodiments of the disclosure provide an image sensor capable of outputting an image having improved image quality.

According to an aspect of an example embodiment, an image sensor may include a first substrate including a focus pixel region and pixel regions around the focus pixel region, each of the focus pixel region and the pixel regions including at least one photoelectric conversion region, color filters provided on the focus pixel region and the pixel regions, respectively, and on a first surface of the first substrate, and micro lenses provided on the color filters, respectively. The micro lenses may include an auto-focus lens on the focus pixel region, a first micro lens adjacent to the auto-focus lens, and a standard micro lens spaced apart from the auto-focus lens. The auto-focus lens may have a first height, the first micro lens may have a second height, the standard micro lens may have a third height, and a difference between the second height and the third height may be smaller than a difference between the first height and the third height.

According to an aspect of an example embodiment, an image sensor may include a substrate including a focus pixel region and pixel regions around the focus pixel region, each of the focus pixel region and the pixel regions including at least one photoelectric conversion region, color filters provided on the focus pixel region and the pixel regions, respectively, and micro lenses provided on the color filters, respectively. The micro lenses may include an auto-focus lens on the focus pixel region, a first micro lens adjacent to a first edge of the auto-focus lens, a second micro lens adjacent to a second edge of the auto-focus lens, and a standard micro lens spaced apart from the auto-focus lens. The auto-focus lens may have a first height, the first micro lens may have a second height, the second micro lens may have a third height, the standard micro lens may have a fourth height, the second height may be larger than the fourth height and smaller than the first height, and the third height may be smaller than the fourth height.

According to an aspect of an example embodiment, an image sensor may include a circuit chip and an image sensor chip stacked on the circuit chip. The image sensor chip may include a first substrate having a first surface and a second surface, which are opposite to each other, and including photoelectric conversion regions provided therein, an isolation pattern provided in the first substrate and between the photoelectric conversion regions, an insulating layer covering the first surface, color filters on the insulating layer, a fence pattern between the color filters, micro lenses provided on the color filters, respectively, a device isolation pattern provided adjacent to the second surface to define an active region, a gate pattern on the second surface, and a first interconnection layer on the second surface. The circuit chip may include a second substrate provided with integrated circuits and a second interconnection layer on the second substrate. The first interconnection layer and the second interconnection layer may be provided to face each other and may be electrically connected to each other. The micro lenses may include an auto-focus lens on the focus pixel region, a first micro lens adjacent to the auto-focus lens, and a standard micro lens spaced apart from the auto-focus lens. The auto-focus lens may have a first height, the first micro lens may have a second height, the standard micro lens may have a third height, and a difference between the second height and the third height may be smaller than a difference between the first height and the third height.

BRIEF DESCRIPTION OF THE DRAWINGS

The above and/or other aspects will be more apparent by describing certain example embodiments with reference to the accompanying drawings, in which.

DETAILED DESCRIPTION

Figure 1:
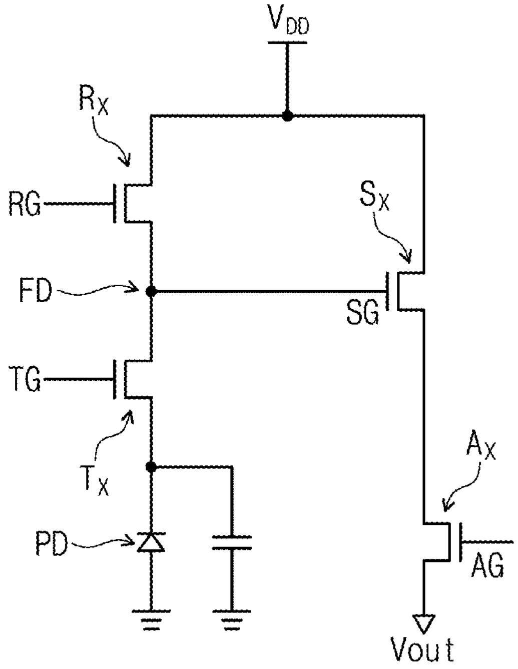
FIG. 1 is a circuit diagram illustrating a pixel of an image sensor according to an example embodiment.

Hereinafter, example embodiments will be described with reference to the accompanying drawings. Like components will be denoted by like reference numerals throughout the specification.

As used herein, "about" and "substantially" will be understood by a person of ordinary skill in the art and will vary in some extent depending on the context in which they are used. If there are uses of the term which are not clear to persons of ordinary skill in the art given the context in which it is used, "about" and "substantially" will mean plus or minus <10% of particular term. As used herein, each numerical range will be understood to be a shorthand disclosure of every discrete point within the range (thus, for example, a range of 1 to 10 is a description of all possible subranges within this range, such as a subrange of 3 to 5, etc.).

FIG. 1 is a circuit diagram illustrating a pixel of an image sensor according to an example embodiment.

Referring to FIG. 1, each of pixels of the image sensor may include a photoelectric conversion region PD, a transfer transistor $T_x$, a source-follower transistor $S_x$, a reset transistor $R_x$, and a selection transistor $A_x$. The transfer transistor $T_x$, the source-follower transistor $S_x$, the reset transistor $R_x$, and the selection transistor $A_x$ may include a transfer gate TG, a source-follower gate SG, a reset gate RG, and a selection gate AG, respectively.

The photoelectric conversion region PD may be a photodiode including an n-type impurity region and a p-type impurity region. A floating diffusion region FD may serve as a drain electrode of the transfer transistor $T_x$. The floating diffusion region FD may serve as a source electrode of the reset transistor $R_x$. The floating diffusion region FD may be electrically connected to the source-follower gate SG of the source-follower transistor $S_x$. The source-follower transistor $S_x$ may be connected to the selection transistor $A_x$.

Hereinafter, an operation of the image sensor will be described with reference to FIG. 1. In a light-blocking state (or in a state in which light is not incident on the image sensor), electric charges may be discharged from the floating diffusion region FD by applying a power voltage VDD to drain electrodes of the reset and source-follower transistors $R_x$ and $S_x$ and turning on the reset transistor $R_x$. Next, the reset transistor $R_x$ may be turned off, and then, if an external light is incident from the outside, electron-hole pairs may be produced in the photoelectric conversion region PD. The holes may be moved to and accumulated in the p-type impurity region of the photoelectric conversion region PD, and the electrons may be moved to and accumulated in the n-type impurity region of the photoelectric conversion region PD. In this state, if the transfer transistor $T_x$ is turned on, the electric charges, such as the electrons and holes, may be transferred to and accumulated in the floating diffusion region FD. A change in an amount of the accumulated charges may lead to a change in gate bias of the source-follower transistor $S_x$ and consequently a change in source potential of the source follower transistor $S_x$. In this case, if the selection transistor $A_x$ is turned on, an amount of the electric charges may be read out as a signal through a column line.

An interconnection line may be electrically connected to at least one of the transfer gate TG, the source-follower gate SG, the reset gate RG, and the selection gate AG. The interconnection line may be configured to apply the power voltage VDD to the drain electrode of the reset transistor $R_x$ or the drain electrode of the source-follower transistor $S_x$. The interconnection line may include the column line connected to the selection transistor $A_x$. The interconnection line may include a first conductive structure 830, which will be described with reference to FIG. 3.

Although the pixel of FIG. 1 is illustrated to have a single photoelectric conversion region PD and four transistors (i.e., $T_x$, $R_x$, $A_x$, and $S_x$), embodiments are not limited thereto. For example, a plurality of pixels may be provided, and the reset transistor $R_x$, the source-follower transistor $S_x$, or the selection transistor $A_x$ may be shared by adjacent one or more of the pixels. Thus, an integration density of the image sensor may be increased.

Figure 2:
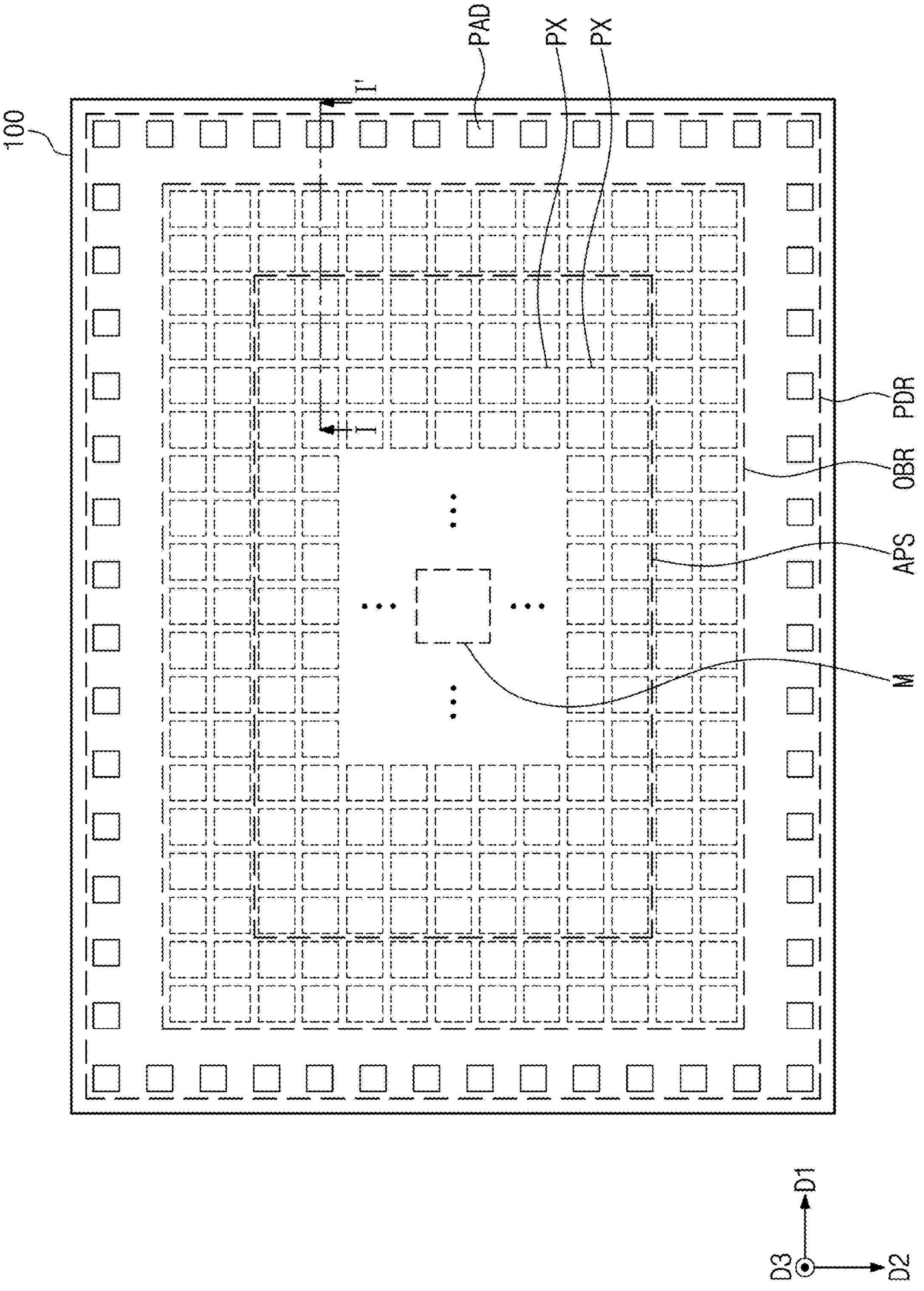
FIG. 2 is a plan view illustrating an image sensor according to an example embodiment.
Figure 3:
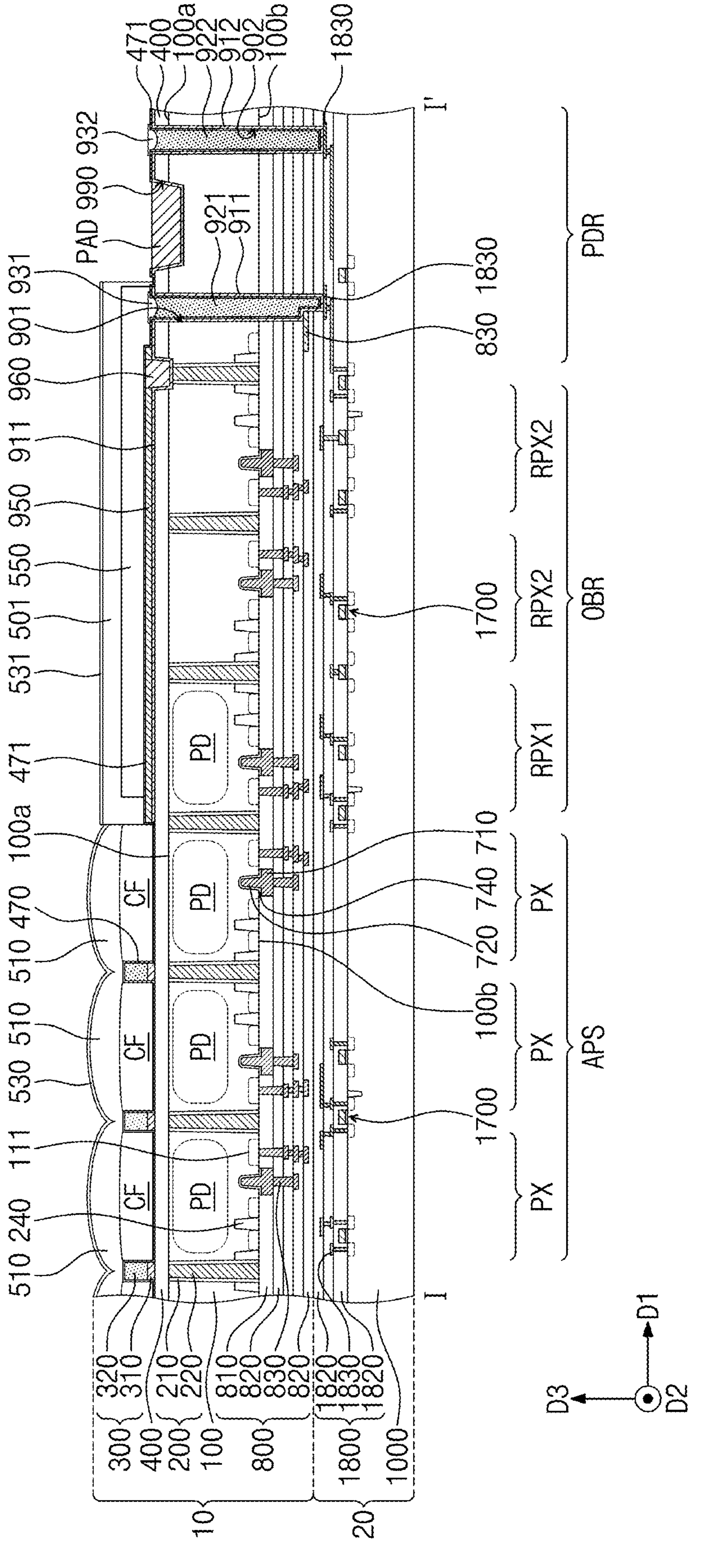
FIG. 3 is a sectional view taken along a line I-I' of FIG. 2.

FIG. 2 is a plan view illustrating an image sensor according to an example embodiment. FIG. 3 is a sectional view taken along a line I-I' of FIG. 2.

Referring to FIGS. 2 and 3, the image sensor may include a sensor chip 10. The sensor chip 10 may include a first substrate 100, a first interconnection layer 800, an insulating layer 400, a protection layer 470, color filters CF, a fence pattern 300, and a micro lens layer 500 (refer to FIG. 6A) that includes a convex lens portion 510.

When viewed in a plan view, the first substrate 100 may include a pixel array region APS, an optical black region OBR, and a pad region PDR. The pixel array region APS may be disposed in a center region of the first substrate 100. The pixel array region APS may include a plurality of pixel regions PX. The pixel described with reference to FIG. 1 may be provided in each of the pixel regions PX of the first substrate 100. For example, the elements constituting the pixel of FIG. 1 may be provided on each of the pixel regions PX. The pixel regions PX may be formed to produce photoelectric signals from incident light and to output the photoelectric signals.

The pixel regions PX may be two-dimensionally arranged to form a plurality of rows and a plurality of columns. The plurality of rows may be parallel to a first direction D1. The plurality of columns may be parallel to a second direction D2. In the present specification, the first direction D1 may be parallel to a first surface 100*a* of the first substrate 100. The second direction D2 may be parallel to the first surface 100*a* of the first substrate 100 but may not be parallel to the first direction D1. For example, the second direction D2 may be substantially perpendicular to the first direction D1. A third direction D3 may be perpendicular to the first direction D1 and the second direction D2. For example, the third direction D3 may be substantially normal to the first surface 100*a* of the first substrate 100.

The pad region PDR may be provided in an edge region of the first substrate 100 to enclose the pixel array region APS. Pads PAD may be provided on the pad region PDR. The pads PAD may be used to output electrical signals, which are produced in the pixel regions PX, to the outside. Alternatively, the pads PAD may be used to deliver an external electrical signal or voltage to the pixel regions PX. Since the pad region PDR is disposed in the edge region of the first substrate 100, the pads PAD may be easily coupled to the outside. The optical black region OBR will be described below. Hereinafter, the pixel array region APS of the sensor chip 10 of the image sensor will be described in more detail.

The first substrate 100 may have the first surface 100*a* and a second surface 100*b* that face opposite to each other. The first surface 100*a* of the first substrate 100 may be a front surface, and the second surface 100*b* may be a rear surface. Light may be incident into the first substrate 100 through the first surface 100*a*. The first substrate 100 may be a semiconductor substrate or a silicon-on-insulator (SOI) substrate.

The semiconductor substrate may include, for example, a silicon substrate, a germanium substrate, or a silicon-germanium substrate. The first substrate 100 may further include group 3 elements. The group 3 element may be an impurity of a first conductivity type. In other words, the first substrate 100 may have the first conductivity type (e.g., a p-type). As an example, the impurity of the first conductivity type may include aluminum (Al), boron (B), indium (In), and/or gallium (Ga).

The first substrate 100 may include a plurality of photoelectric conversion regions PD provided therein. The photoelectric conversion regions PD may be located between the first surface 100*a* and the second surface 100*b* of the first substrate 100. The photoelectric conversion regions PD may be respectively provided in the pixel regions PX of the first substrate 100. The photoelectric conversion region PD may be the same as the photoelectric conversion region PD of FIG. 1.

The photoelectric conversion region PD may further include group 5 elements. The group 5 element may be an impurity of a second conductivity type. In other words, the photoelectric conversion region PD may be an impurity region of the second conductivity type. The second conductivity type (e.g., an n-type) may be different from the first conductivity type. The impurity of the second conductivity type may include phosphorus, arsenic, bismuth, and/or antimony. The photoelectric conversion region PD may be adjacent to the first surface 100*a* of the first substrate 100. The photoelectric conversion region PD may be extended from the first surface 100*a* toward the second surface 100*b*.

An isolation pattern 200 may be provided in the first substrate 100 to define the pixel regions PX. For example, the isolation pattern 200 may be provided between adjacent ones of the pixel regions PX. The isolation pattern 200 may be a pixel isolation pattern. The isolation pattern 200 may be provided in a first trench 201. The first trench 201 may be recessed from the second surface 100*b* of the first substrate 100 toward the first surface 100*a*.

The isolation pattern 200 may be a deep trench isolation layer. In an example embodiment, the isolation pattern 200 may penetrate the first substrate 100. In an example embodiment, the isolation pattern 200 may not penetrate the first substrate 100 and may be spaced apart from the first surface 100*a* of the first substrate 100. A width of the isolation pattern 200 adjacent to the second surface 100*b* may be larger than a width of the isolation pattern 200 adjacent to the first surface 100*a*.

The isolation pattern 200 may include a first isolation pattern 210 and a second isolation pattern 220. The first isolation pattern 210 may be provided on an inner side surface of the first trench 201. The first isolation pattern 210 may be formed of or include at least one of, for example, silicon-based insulating materials (e.g., silicon nitride, silicon oxide, and/or silicon oxynitride) and/or high-k dielectric materials (e.g., hafnium oxide and/or aluminum oxide). As another example, the first isolation pattern 210 may include a plurality of layers, at least two of which are formed of or include different materials from each other. The first isolation pattern 210 may have a refractive index lower than the first substrate 100. Accordingly, it may be possible to prevent or suppress a cross-talk phenomenon between the pixel regions PX of the first substrate 100.

The second isolation pattern 220 may be provided in the first isolation pattern 210. The first isolation pattern 210 may be interposed between the second isolation pattern 220 and the first substrate 100. The second isolation pattern 220 may be spaced apart from the first substrate 100 by the first isolation pattern 210. Accordingly, during the operation of the image sensor, the second isolation pattern 220 may be electrically separated from the first substrate 100. The second isolation pattern 220 may be formed of or include at least one of conductive materials (e.g., doped poly silicon). The second isolation pattern 220 may contain impurities of the first or second conductivity type.

The color filters CF may be disposed on the first surface 100*a* of the first substrate 100 and on the pixel regions PX, respectively. For example, the color filters CF may be respectively provided at positions corresponding to the photoelectric conversion regions PD. Each of the color filters CF may be one of red, blue, and green filters. The color filters CF may be arranged to form color filter arrays. For example, the color filters CF may be two-dimensionally arranged in a Bayer pattern.

The fence pattern 300 may be disposed on the isolation pattern 200. For example, the fence pattern 300 may be vertically overlapped with the isolation pattern 200. The fence pattern 300 may be interposed between adjacent two ones of the color filters CF to separate the color filters CF from each other. For example, the color filters CF may be physically and optically separated from each other by the fence pattern 300.

The fence pattern 300 may have a planar shape corresponding to the isolation pattern 200. For example, the fence pattern 300 may have a grid shape. When viewed in a plan view, the fence pattern 300 may be provided to surround each of the pixel regions PX. The fence pattern 300 may surround each of the color filters CF. The fence pattern 300 may include first portions and second portions. The first portions may be extended parallel to the first direction D1 and may be spaced apart from each other in the second direction D2. The second portions may be extended parallel to the second direction D2 and may be spaced apart from each other in the first direction D1. The second portions may cross the first portions.

The fence pattern 300 may include a first fence pattern 310 and a second fence pattern 320. The first fence pattern 310 may be disposed between the insulating layer 400 and the second fence pattern 320. The first fence pattern 310 may be formed of or include at least one of conductive materials (e.g., metals and/or metal nitrides). For example, the first fence pattern 310 may be formed of or include titanium and/or titanium nitride.

The second fence pattern 320 may be disposed on the first fence pattern 310. The second fence pattern 320 may be formed of or include a material different from the first fence pattern 310. The second fence pattern 320 may be formed of or include an organic material. The second fence pattern 320 may include a low-refractive material and may have an insulating property.

The insulating layer 400 may be interposed between the first substrate 100 and the color filters CF and between the isolation pattern 200 and the fence pattern 300. The insulating layer 400 may cover the first surface 100*a* of the first substrate 100 and a top surface of the isolation pattern 200. The insulating layer 400 may be a back-side insulating layer. The insulating layer 400 may include a bottom antireflective coating (hereinafter, BARC) layer. The insulating layer 400 may include a plurality of layers which are configured to have different functions from each other.

In an embodiment, the insulating layer 400 may include a first insulating layer, a second insulating layer, a third insulating layer, a fourth insulating layer, and a fifth insulating layer, which are sequentially stacked on the first surface 100*a* of the first substrate 100. The first insulating layer may cover the first surface 100*a* of the first substrate 100. The first and second insulating layers may be fixed-charge layers. Each of the fixed-charge layers may be formed of a metal oxide layer or a metal fluoride layer. In an embodiment, the metal oxide layer may have an oxygen content that is lower than that of its stoichiometric ratio, and the metal fluoride layer may have a fluorine content that is lower than that of its stoichiometric ratio.

For example, the first insulating layer may be formed of or include metal oxide or metal fluoride containing at least one metallic element from hafnium (Hf), zirconium (Zr), aluminum (Al), tantalum (Ta), titanium (Ti), yttrium (Y), and lanthanide. The second insulating layer may be formed of or include at least one of metal oxide or metal fluoride containing at least one metallic element listed above for the first insulating layer. However, the material for the second insulating layer may be different from that for the first insulating layer. As an example, the first insulating layer may be formed of or include aluminum oxide, and the second insulating layer may be formed of or include hafnium oxide.

Each of the first and second insulating layers may have a negative fixed charge and may be configured to lead to hole accumulation. Due to the first and second insulating layers, it may be possible to effectively suppress dark current and white spot issues, which may occur in the first substrate 100. A thickness of the second insulating layer may be larger than a thickness of the first insulating layer.

The third insulating layer may be disposed on the second insulating layer. The third insulating layer may be formed of or include a first silicon-containing material. The first silicon-containing material may include, for example, tetraethyl orthosilicate (TEOS) or silicon oxide. The third insulating layer may have a good gap-filling property. The third insulating layer may be formed by, for example, a plasma-enhanced chemical vapor deposition (PE-CVD) process, but the disclosure is not limited to this example. A thickness of the third insulating layer may be larger than the thickness of the first insulating layer and may be larger than the thickness of the second insulating layer.

The fourth insulating layer may be disposed on the third insulating layer. The fourth insulating layer may be formed of or include a material different from the third insulating layer. The fourth insulating layer may include a second silicon-containing material, which is different from the first silicon-containing material. As an example, the fourth insulating layer may be formed of or include silicon nitride. A thickness of the fourth insulating layer may be larger than the thickness of the third insulating layer.

The fifth insulating layer may be disposed between the fourth insulating layer and the first fence pattern 310 and between the fourth insulating layer and the color filters CF. The fifth insulating layer may be in physical contact with a bottom surface of the first fence pattern 310. The fifth insulating layer may be an adhesive layer or a capping layer. The fifth insulating layer may be formed of or include at least one of high-k dielectric materials or metal oxide materials. The fifth insulating layer may be formed of or include the same material as the second insulating layer. For example, the fifth insulating layer may be formed of or include hafnium oxide. A thickness of the fifth insulating layer may be larger than the thickness of the first insulating layer and the thickness of the second insulating layer and may be smaller than the thickness of the third insulating layer and the thickness of the fourth insulating layer.

The number of the layers constituting the insulating layer 400 may be variously changed and thus different from the embodiments described above. For example, at least one of the first to fifth insulating layers may be omitted.

The protection layer 470 may cover the insulating layer 400 and the fence pattern 300. The protection layer 470 may be formed of or include at least one of high-k dielectric materials and may have an insulating property. For example, the protection layer 470 may be formed of or include aluminum oxide or hafnium oxide. In an embodiment, the protection layer 470 may be formed of or include aluminum oxide, but the disclosure is not limited to this example. The protection layer 470 may protect the photoelectric conversion regions PD of the first substrate 100 from harmful external environment (e.g., moisture).

The color filters CF may be provided on the protection layer 470. The color filters CF may be spaced apart from each other by the fence pattern 300. The color filters CF may not cover a top surface of the fence pattern 300.

In an embodiment, referring to FIG. 3, each of the color filters CF may have an upward convex top surface. For example, a level of a center portion of the top surface of the color filter CF may be higher than a level of an edge portion of the top surface. However, the sectional shape of the color filters CF is not limited thereto.

The micro lens layer 500 may be provided on the first surface 100*a* of the first substrate 100. For example, the micro lens layer 500 may be provided on the color filters CF and the fence pattern 300. The protection layer 470 may be interposed between the second fence pattern 320 and the micro lens layer 500.

The micro lens layer 500 may include a plurality of convex lens portions 510. The lens portions 510 may be respectively provided at positions corresponding to the photoelectric conversion regions PD of the first substrate 100. For example, the lens portions 510 may be provided on the color filters CF, respectively, and may correspond to the color filters CF, respectively. The lens portions 510 may be arranged in the first direction D1 and the second direction D2 to form a two-dimensional array, when viewed in a plan view. Each of the lens portions 510 may protrude in a direction away from the first surface 100*a* of the first substrate 100. Each of the lens portions 510 may have a hemispherical section. The lens portions 510 may condense an incident light.

The micro lens layer 500 may be transparent, and thus, an incident light may pass through the micro lens layer 500. The micro lens layer 500 may be formed of or include an organic material (e.g., polymer). For example, the micro lens layer 500 may be formed of or include at least one of photoresist materials or thermosetting resins.

A lens coating layer 530 may be provided on the micro lens layer 500. The lens coating layer 530 may be transparent. The lens coating layer 530 may conformally cover a top surface of the micro lens layer 500. The lens coating layer 530 may protect the micro lens layer 500.

The first substrate 100 may include impurity regions 111, which are provided adjacent to the second surface 100*b*. The impurity regions 111 may be disposed in each of the pixel regions PX. The impurity regions 111 may have bottom surfaces that are vertically spaced apart from the photoelectric conversion regions PD. The impurity regions 111 may be doped to have the second conductivity type (e.g., the n-type). The impurity regions 111 may be active regions. Here, the active region may be a region, which is used for an operation of a transistor, and may include the floating diffusion region FD described with reference to FIG. 1 and/or source/drain regions of the transistor. The transistor for which the impurity regions 111 may be used may include the transfer transistor $T_x$, the source-follower transistor $S_x$, the reset transistor $R_x$x, and/or the selection transistor $A_x$ described with reference to FIG. 1.

A device isolation pattern 240 may be provided to be adjacent to the second surface 100*b* of the first substrate 100. The device isolation pattern 240 may define the active regions. Concretely, in each of the pixel regions PX, the device isolation pattern 240 may define the impurity regions 111. The impurity regions 111 may be separated from each other by the device isolation pattern 240. The device isolation pattern 240 may be provided in a second trench, which is recessed from the second surface 100*b* of the first substrate 100. The device isolation pattern 240 may be a shallow trench isolation (STI) layer. A height of the device isolation pattern 240 may be smaller than the height of the isolation pattern 200. A portion of the device isolation pattern 240 may be connected to a side surface of the first isolation pattern 210. The device isolation pattern 240 may be formed of or include at least one of, for example, silicon oxide, silicon nitride, and/or silicon oxynitride.

A gate pattern 700 (refer to FIG. 4) may be provided on the second surface 100*b* of the first substrate 100. The gate pattern 700 may serve as the gate electrode of the transfer transistor $T_x$, the source-follower transistor $S_x$, the reset transistor $R_x$, and/or the selection transistor $A_x$ previously described with reference to FIG. 1. For example, the gate pattern 700 may include the transfer gate TG, the source-follower gate SG, the reset gate RG, and/or the selection gate AG. Although FIG. 3 illustrates an example in which one gate pattern 700 is disposed on each pixel region PX, embodiments are not limited to this example. For example, a plurality of gate patterns 700 may be disposed on each pixel region PX. For the sake of simplicity, the description that follows will refer to an example in which one gate pattern 700 is provided.

The gate pattern 700 may have a buried-type gate structure. For example, the gate pattern 700 may include a first portion 710 and a second portion 720. The first portion 710 of the gate pattern 700 may be disposed on the second surface 100*b* of the first substrate 100. The second portion 720 of the gate pattern 700 may be buried in the first substrate 100. The second portion 720 of the gate pattern 700 may be connected to the first portion 710. Unlike what is illustrated in the drawings, the gate pattern 700 may have a planar gate structure. In this case, the gate pattern 700 may not include the second portion 720. The gate pattern 700 may be formed of or include at least one of metallic materials, metal silicide materials, poly silicon, and combinations thereof. Here, the poly silicon may include doped poly silicon.

A gate insulating pattern 740 may be interposed between the gate pattern 700 and the first substrate 100. The gate insulating pattern 740 may be formed of or include at least one of, for example, silicon-based insulating materials (e.g., silicon oxide, silicon nitride, and/or silicon oxynitride) and/or high-k dielectric materials (e.g., hafnium oxide and/or aluminum oxide).

The first interconnection layer 800 may be disposed on the second surface 100*b* of the first substrate 100. The first interconnection layer 800 may include a first interlayer insulating layer 810, second interlayer insulating layers 820, and the first conductive structure 830. The first interlayer insulating layer 810 may cover the second surface 100*b* of the first substrate 100 and the gate pattern 700. The second interlayer insulating layers 820 may be stacked on the first interlayer insulating layer 810. The first and second interlayer insulating layers 810 and 820 may be formed of or include at least one of silicon-based insulating materials (e.g., silicon oxide, silicon nitride, and/or silicon oxynitride).

The first conductive structure 830 may be provided in the interlayer insulating layers 810 and 820. The first conductive structure 830 may include a contact plug portion, a line portion, and a via portion. The contact plug portion may be provided in the first interlayer insulating layer 810 and may be electrically connected to one of the impurity regions 111 and the gate pattern 700. The line portion of the first conductive structure 830 may be interposed between two adjacent ones of the interlayer insulating layers 810 and 820. The line portion may be connected to the contact plug portion. The via portion of the first conductive structure 830 may be provided to penetrate at least one of the second interlayer insulating layers 820 and may be connected to the line portion. The first conductive structure 830 may be used to deliver a photoelectric signal, which is output from the photoelectric conversion regions PD.

Hereinafter, the circuit chip 20 of the image sensor and the optical black region OBR and the pad region PDR of the first substrate 100 will be described in more detail. Referring back to FIGS. 2 and 3, the optical black region OBR of the first substrate 100 may be interposed between the pixel array region APS and the pad region PDR. The optical black region OBR may include a first reference pixel region RPX1 and a second reference pixel region RPX2. The first reference pixel region RPX1 may be disposed between the second reference pixel region RPX2 and the pixel array region APS. In the optical black region OBR, the photoelectric conversion region PD may be provided in the first reference pixel region RPX1. The photoelectric conversion region PD of the first reference pixel region RPX1 may have the same planar area and volume as the photoelectric conversion regions PD of the pixel regions PX. The photoelectric conversion region PD may not be provided in the second reference pixel region RPX2. The impurity regions 111, the gate pattern 700, and the device isolation pattern 240 may be disposed in each of the first and second reference pixel regions RPX1 and RPX2.

The insulating layer 400 may be extended from the pixel array region APS to the pad region PDR through the optical black region OBR. A light-blocking layer 950 may be provided on the optical black region OBR. The light-blocking layer 950 may be disposed on a top surface of the insulating layer 400. Due to the light-blocking layer 950, light may be prevented from being incident into the photoelectric conversion region PD of the optical black region OBR. The pixels in the first and second reference pixel regions RPX1 and RPX2 of the optical black region OBR may be configured to output noise signals, not photoelectric signals. The noise signal may be produced by electrons, which are generated by heat or a dark current. The light-blocking layer 950 may not be provided in the pixel array region APS, and thus, light may be incident into the photoelectric conversion regions PD in the pixel array region APS. It may be possible to remove the noise signal from photoelectric signals, which are output from the pixel regions PX. The light-blocking layer 950 may be formed of or include at least one of metallic materials (e.g., tungsten, copper, aluminum, or alloys thereof).

In the optical black region OBR of the first substrate 100, a first conductive pattern 911 may be disposed between the insulating layer 400 and the light-blocking layer 950. The first conductive pattern 911 may serve as a barrier layer or an adhesive layer. The first conductive pattern 911 may be formed of or include at least one of metallic materials and/or metal nitrides. For example, the first conductive pattern 911 may be formed of or include at least one of metallic materials (e.g., copper, tungsten, aluminum, titanium, tantalum, or alloys thereof). The first conductive pattern 911 may not be extended to a region on the pixel array region APS of the first substrate 100.

In the optical black region OBR of the first substrate 100, a contact plug 960 may be provided on the first surface 100*a* of the first substrate 100. The contact plug 960 may be disposed on the outermost one of the isolation patterns 200 in the optical black region OBR. A contact trench penetrating the insulating layer 400 may be defined on the first surface 100*a* of the first substrate 100, and the contact plug 960 may be provided in the contact trench.

The contact plug 960 may be formed of or include a material that is different from the light-blocking layer 950. For example, the contact plug 960 may be formed of or include at least one of metallic materials (e.g., aluminum). The first conductive pattern 911 may be extended into regions between the contact plug 960 and the insulating layer 400 and between the contact plug 960 and the isolation pattern 200. The contact plug 960 may be electrically connected to the second isolation pattern 220 through the first conductive pattern 911. A negative bias voltage may be applied to the second isolation pattern 220 through the contact plug 960.

A protection insulating layer 471 may be provided on the optical black region OBR. The protection insulating layer 471 may be disposed on a top surface of the light-blocking layer 950 and a top surface of the contact plug 960. The protection insulating layer 471 may include the same material as the protection layer 470 and may be connected to the protection layer 470. The protection insulating layer 471 and the protection layer 470 may be provided as a single object. Alternatively, the protection insulating layer 471 may be formed by a process, which is distinct from that for the protection layer 470, and may be spaced apart from the protection layer 470. The protection insulating layer 471 may be formed of or include at least one of high-k dielectric materials (e.g., aluminum oxide and/or hafnium oxide).

A filtering layer 550 may be further disposed on the first surface 100*a* of the optical black region OBR. The filtering layer 550 may cover a top surface of the protection insulating layer 471. The filtering layer 550 may block light which is not filtered by the color filters CF. For example, the filtering layer 550 may be configured to block infrared light. The filtering layer 550 may include a blue color filter but embodiments are not limited to this example.

An organic layer 501 may be provided on a top surface of the filtering layer 550. The organic layer 501 may be transparent. A top surface of the organic layer 501 may be substantially flat. The organic layer 501 may be formed of or include, for example, polymer. The organic layer 501 may have an insulating property. In an embodiment, unlike what is illustrated in the drawings, the organic layer 501 may be connected to the micro lens layer 500. The organic layer 501 may be formed of or include the same material as the micro lens layer 500.

A coating layer 531 may be provided on the organic layer 501. The coating layer 531 may conformally cover the top surface of the organic layer 501. The coating layer 531 may include an insulating material and may be transparent. The coating layer 531 may be formed of or include the same material as the lens coating layer 530.

The image sensor may further include the circuit chip 20. The circuit chip 20 may be stacked on the sensor chip 10. The circuit chip 20 may include a second interconnection layer 1800 and a second substrate 1000. The second interconnection layer 1800 may be interposed between the first interconnection layer 800 and the second substrate 1000. Integrated circuits 1700 may be disposed on a top surface of the second substrate 1000 or in the second substrate 1000. The integrated circuits 1700 may include logic circuits, memory circuits, or combinations thereof. The integrated circuits 1700 may include, for example, transistors.

The second interconnection layer 1800 may include third interlayer insulating layers 1820 and a second conductive structure 1830. The second conductive structures 1830 may be provided between the third interlayer insulating layers 1820 or in the third interlayer insulating layers 1820. The second conductive structures 1830 may be electrically connected to the integrated circuits 1700. The second interconnection layer 1800 may further include a via pattern, and in an embodiment, the via pattern may be coupled to the second conductive structures 1830 in the third interlayer insulating layers 1820.

The pad PAD may be provided on the pad region PDR of the first substrate 100. The pad PAD may be adjacent to the first surface 100*a* of the first substrate 100. The pad PAD may be buried in the first substrate 100. For example, a pad trench 990 may be defined on the first surface 100*a* of the pad region PDR of the first substrate 100, and the pad PAD may be provided in the pad trench 990. The pad PAD may be formed of or include at least one of metallic materials (e.g., aluminum, copper, tungsten, titanium, tantalum, or alloys thereof). In a process of mounting the image sensor, a bonding wire may be formed on the pad PAD and may be coupled to the pad PAD. The pad PAD may be electrically connected to an external device through the bonding wire.

A first penetration hole 901 may be defined at a region adjacent to a first side of the pad PAD. The first penetration hole 901 may be provided between the pad PAD and the contact plug 960. The first penetration hole 901 may penetrate the insulating layer 400, the first substrate 100, and the first interconnection layer 800. In an embodiment, the first penetration hole 901 may further penetrate at least a portion of the second interconnection layer 1800. The first penetration hole 901 may have a first bottom surface and a second bottom surface. The first bottom surface of the first penetration hole 901 may be formed to expose the first conductive structure 830. The second bottom surface of the first penetration hole 901 may be disposed at a level lower than the first bottom surface. The second bottom surface of the first penetration hole 901 may be formed to expose the second conductive structure 1830.

The first conductive pattern 911 may be extended from the optical black region OBR to a region on the pad region PDR. The first conductive pattern 911 may cover an inner side surface of the first penetration hole 901. The first conductive pattern 911 in the first penetration hole 901 may be in contact with a top surface of the first conductive structure 830. Accordingly, the first conductive structure 830 may be electrically connected to the second isolation pattern 220 through the first conductive pattern 911.

The first conductive pattern 911 in the first penetration hole 901 may also be coupled to a top surface of the second conductive structure 1830. The second conductive structure 1830 may be electrically connected to the first conductive structure 830 and the second isolation pattern 220 through the first conductive pattern 911.

A first gapfill pattern 921 may be provided in the first penetration hole 901 to fill the first penetration hole 901. The first gapfill pattern 921 may be formed of or include at least one of low refractive materials and may have an insulating property. The first gapfill pattern 921 may be formed of or include the same material as the first fence pattern 310. A top surface of the first gapfill pattern 921 may have a recessed portion. For example, a center portion of the top surface of the first gapfill pattern 921 may be lower than its edge portion.

A first capping pattern 931 may be disposed on the top surface of the first gapfill pattern 921 to fill the recessed portion. The first capping pattern 931 may have a substantially flat top surface. The first capping pattern 931 may be formed of or include at least one of insulating polymers (e.g., photoresist materials).

A second penetration hole 902 may be defined at a region adjacent to a second side of the pad PAD. The second penetration hole 902 may be provided to penetrate the insulating layer 400, the first substrate 100, and the first interconnection layer 800. In an embodiment, the second penetration hole 902 may penetrate a portion of the second interconnection layer 1800 and may expose the second conductive structure 1830.

A second conductive pattern 912 may be provided on the pad region PDR. The second conductive pattern 912 may be provided in the second penetration hole 902 to conformally cover side and bottom surfaces of the second penetration hole 902. The second conductive pattern 912 may be electrically connected to the second conductive structure 1830.

The second conductive pattern 912 may be interposed between the pad PAD and the pad trench 990 to cover bottom and side surfaces of the pad PAD. During the operation of the image sensor, the integrated circuits 1700 of the circuit chip 20 may transmit and receive electrical signals through the second conductive structure 1830, the second conductive pattern 912, and the pad PAD.

A second gapfill pattern 922 may be provided in the second penetration hole 902 to fill the second penetration hole 902. The second gapfill pattern 922 may be formed of or include at least one of low refractive materials and may have an insulating property. For example, the second gapfill pattern 922 may be formed of or include the same material as the first fence pattern 310. A top surface of the second gapfill pattern 922 may have a recessed portion.

A second capping pattern 932 may be disposed on the top surface of the second gapfill pattern 922 to fill the recessed portion. The second capping pattern 932 may have a substantially flat top surface. The second capping pattern 932 may be formed of or include at least one of insulating polymers (e.g., photoresist materials).

The protection insulating layer 471 may be extended from the optical black region OBR to a region on the pad region PDR. The protection insulating layer 471 may be provided on the top surface of the insulating layer 400 and may be extended into the first penetration hole 901 and the second penetration hole 902. In the first penetration hole 901, the protection insulating layer 471 may be interposed between the first conductive pattern 911 and the first gapfill pattern 921. In the second penetration hole 902, the protection insulating layer 471 may be interposed between the second conductive pattern 912 and the second gapfill pattern 922. The protection insulating layer 471 may be provided to expose the pad PAD.

Figure 4:
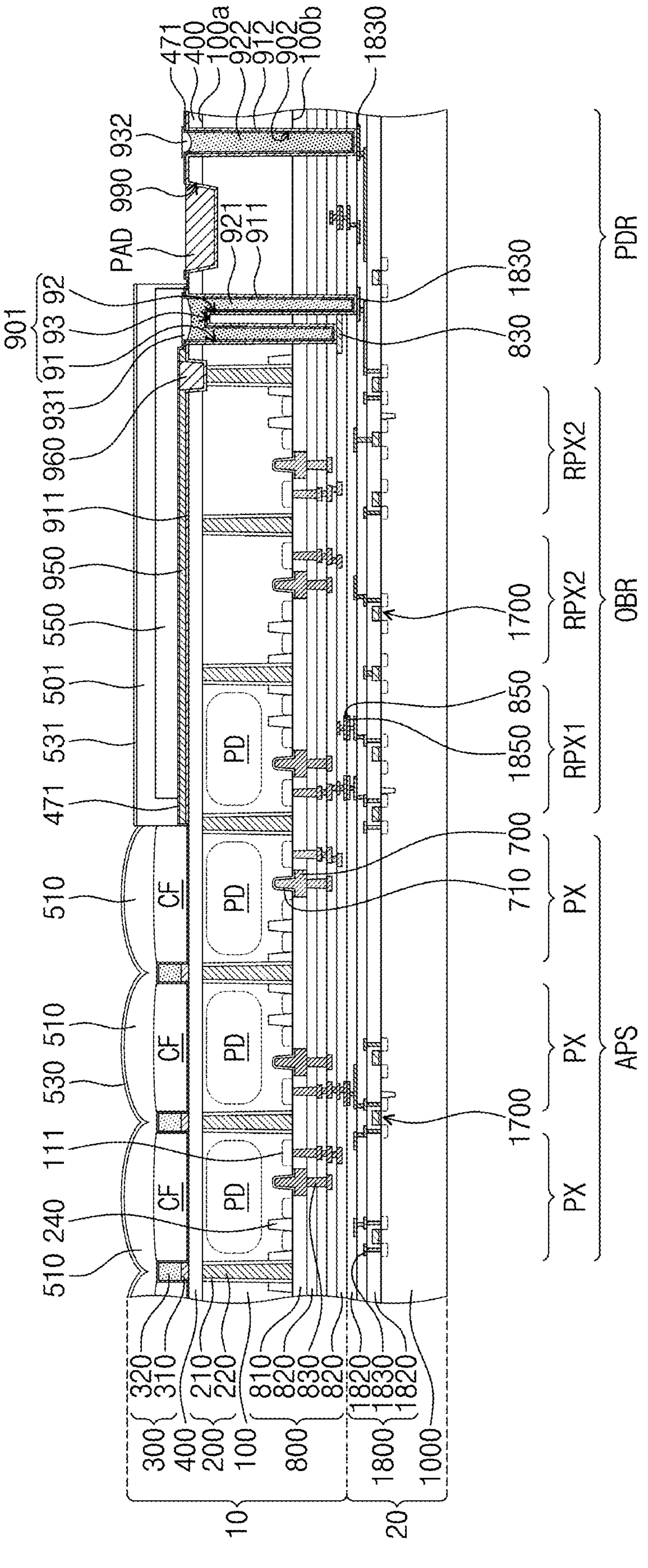
FIG. 4 is a sectional view, which is taken along the line I-I' of FIG. 2 to illustrate an image sensor according to an example embodiment.

FIG. 4 is a sectional view, which is taken along the line I-I' of FIG. 2 to illustrate an image sensor according to an example embodiment. For concise description, an element previously described with reference to FIGS. 1 to 3 may be identified by the same reference number without repeating an overlapping description thereof.

Referring to FIGS. 2 and 4, the image sensor may include the sensor chip 10 and the circuit chip 20. The sensor chip 10 may include a first connection pad 850. The first connection pad 850 may be exposed on a bottom surface of the sensor chip 10. The first connection pad 850 may be disposed in the lowermost one of the second interlayer insulating layers 820. The first connection pad 850 may be electrically connected to the first conductive structure 830. The first connection pad 850 may be formed of or include at least one of conductive materials (e.g., metals). For example, the first connection pad 850 may be formed of or include copper. Alternatively, the first connection pad 850 may be formed of or include at least one of aluminum, tungsten, titanium, and/or alloys thereof.

The circuit chip 20 may include a second connection pad 1850. The second connection pad 1850 may be exposed on a top surface of the circuit chip 20. The second connection pad 1850 may be disposed in the uppermost one of the third interlayer insulating layers 1820. The second connection pad 1850 may be electrically connected to the integrated circuits 1700. The second connection pad 1850 may be formed of or include at least one of conductive materials (e.g., metals). For example, the second connection pad 1850 may be formed of or include copper. Alternatively, the second connection pad 1850 may be formed of or include at least one of aluminum, tungsten, titanium, and/or alloys thereof.

The circuit chip 20 may be connected to the sensor chip 10 in a direct bonding manner. For example, the first connection pad 850 and the second connection pad 1850 may be vertically aligned to each other and may be in contact with each other. Accordingly, the second connection pad 1850 may be directly bonded to the first connection pad 850. As a result, the integrated circuits 1700 of the circuit chip 20 may be electrically connected to the transistors or the pad PAD of the sensor chip 10 through the first and second connection pads 850 and 1850.

In an example embodiment, the second interlayer insulating layer 820 may be directly adhered to the third interlayer insulating layer 1820. In this case, a chemical bond may be formed between the second interlayer insulating layer 820 and the third interlayer insulating layer 1820.

The first penetration hole 901 may include a first penetration hole portion 91, a second penetration hole portion 92, and a third penetration hole portion 93. The first penetration hole portion 91 may penetrate the insulating layer 400, the first substrate 100, and the first interconnection layer 800 and may have a first bottom surface. The second penetration hole portion 92 may penetrate the insulating layer 400, the first substrate 100, and the first interconnection layer 800 and may be extended into an upper portion of the second interconnection layer 1800. The second penetration hole portion 92 may have a second bottom surface, which is formed to expose a top surface of the second conductive structure 1830. A side surface of the second penetration hole portion 92 may be spaced apart from a side surface of the first penetration hole portion 91. The third penetration hole portion 93 may be provided between an upper portion of the first penetration hole portion 91 and an upper portion of the second penetration hole portion 92 and may be connected to the upper portion of the first penetration hole portion 91 and the upper portion of the second penetration hole portion 92. The first conductive pattern 911, the protection insulating layer 471, and the first gapfill pattern 921 may be provided in the first penetration hole 901. The first conductive pattern 911 may cover inner surfaces of the first penetration hole portion 91, the second penetration hole portion 92, and the third penetration hole portion 93.

Figure 5:
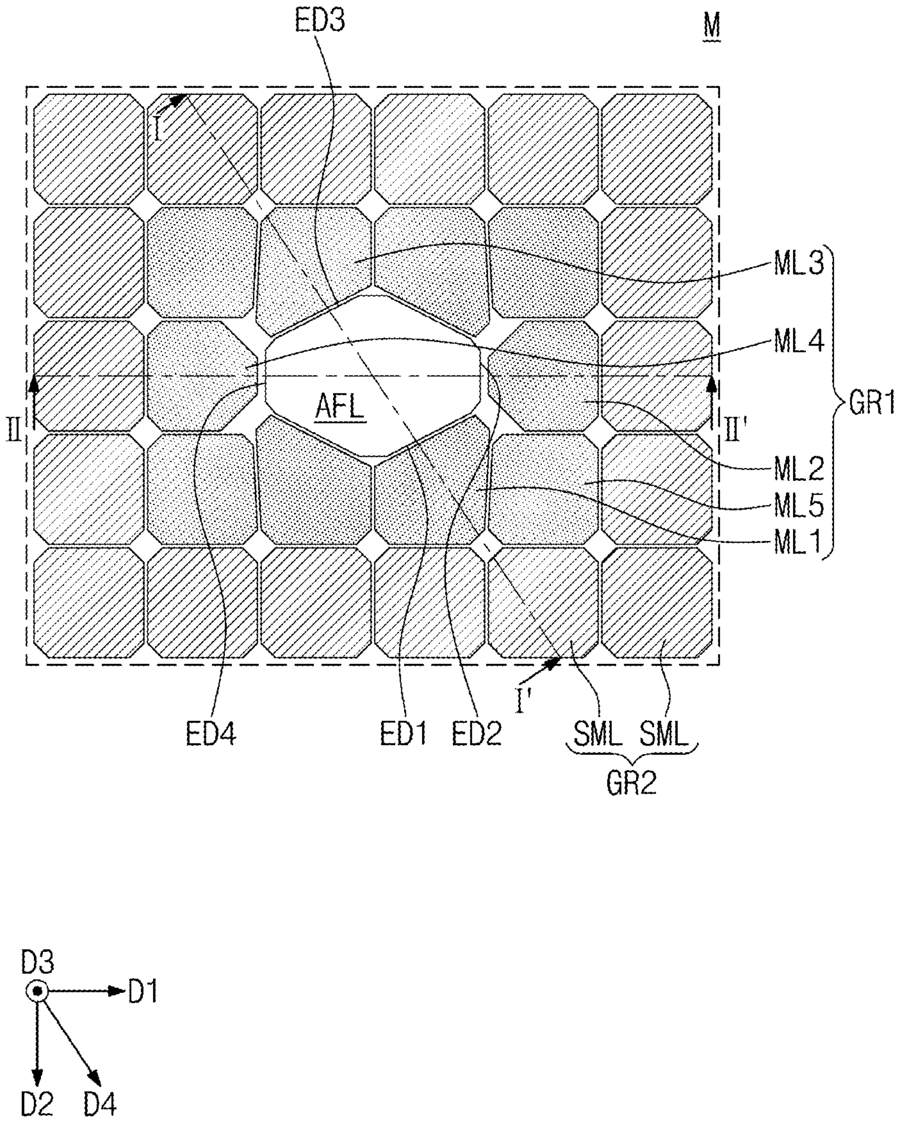
FIG. 5 is a plan view illustrating a portion (e.g., a portion M of FIG. 2) of micro lenses according to an example embodiment.
Figure 6A:
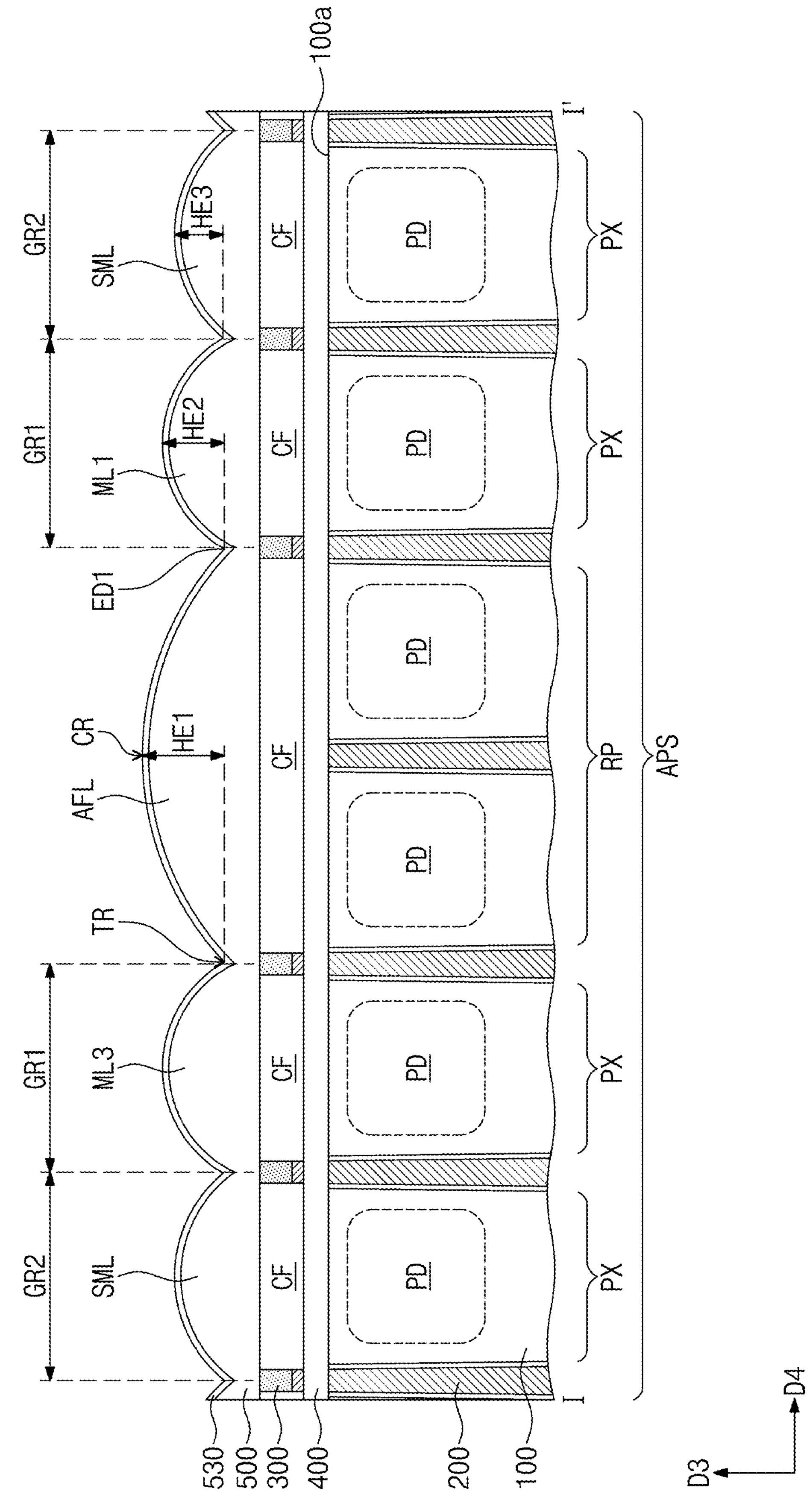
FIG. 6A is a sectional view taken along a line I-I' of FIG. 5.
Figure 6B:
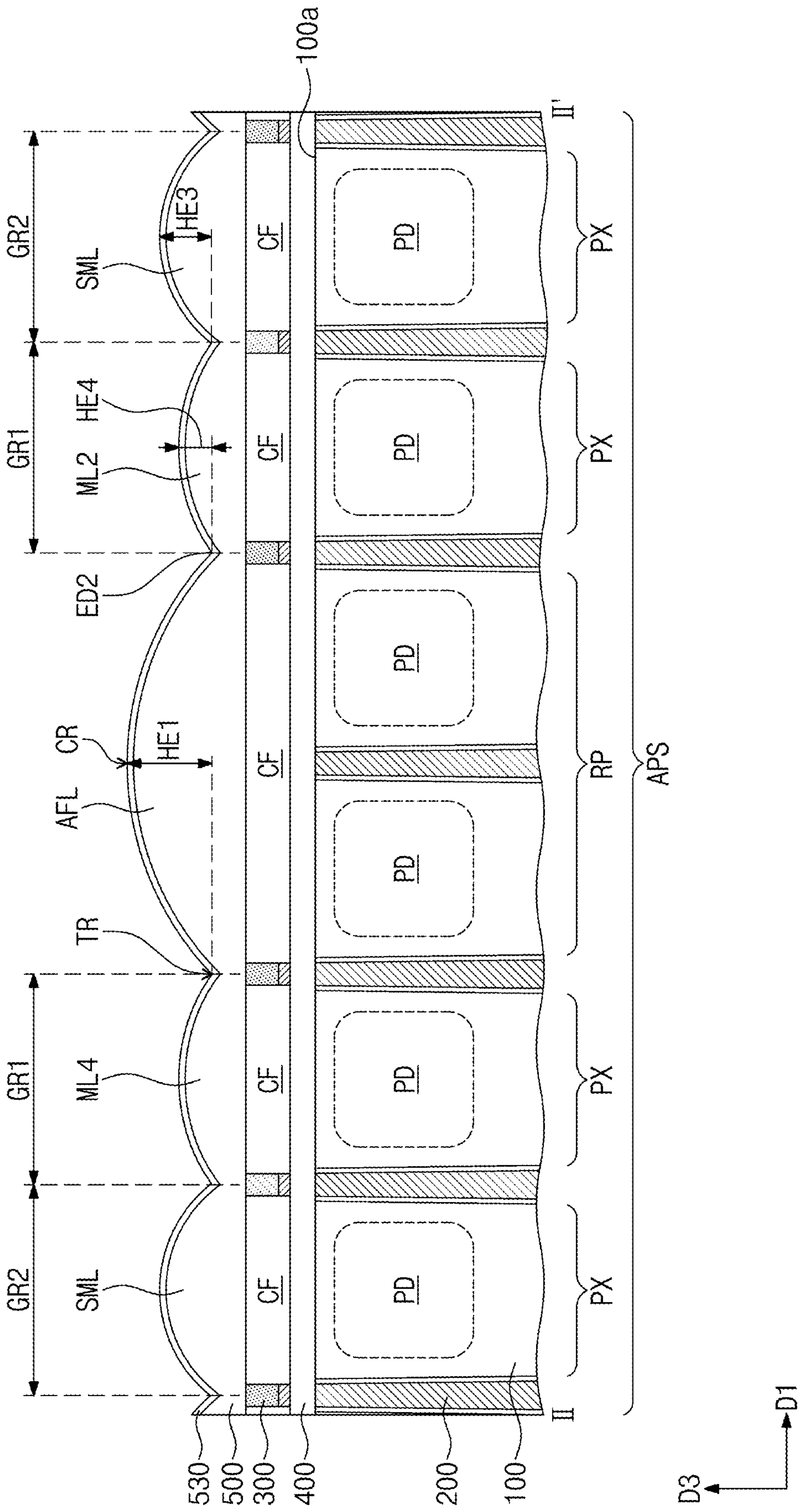
FIG. 6B is a sectional view taken along a line II-II' of FIG. 5.

FIG. 5 is a plan view illustrating a portion (e.g., a portion M of FIG. 2) of micro lenses according to an example embodiment. FIG. 6A is a sectional view taken along a line I-I' of FIG. 5. FIG. 6B is a sectional view taken along a line II-II' of FIG. 5. For concise description, an element previously described with reference to FIGS. 1 to 3 may be identified by the same reference number without repeating an overlapping description thereof.

Referring to FIGS. 5, 6A, and 6B, the image sensor may include the first substrate 100. The image sensor may further include the insulating layer 400, the color filters CF, the fence pattern 300, and the micro lens layer 500, which are provided on the first surface 100*a* of the first substrate 100. In order to reduce complexity in the drawings, elements below the first substrate 100 are omitted from FIGS. 6A, 6B, 7 to 11, 12A, and 12B and they may be configured to have substantially the same features as those in the embodiment described with reference to FIGS. 3 and 4 and included in any one of the embodiments of FIGS. 6A, 6B, 7 to 11, 12A, and 12B.

The pixel array region APS of the first substrate 100 may include a focus pixel region RP and the pixel regions PX. When viewed in a plan view, the pixel regions PX may be two-dimensionally arranged to surround the focus pixel region RP.

In an example embodiment, the focus pixel region RP may include a pair of the photoelectric conversion regions PD and the device isolation pattern 240 therebetween. The focus pixel region RP may have substantially the same area as the sum of a pair of adjacent pixel regions PX.

The focus pixel region RP may correct a focus of an image emitted from the pixel regions PX but may not output an image of a subject. In detail, the photoelectric conversion regions PD in the focus pixel region RP may be spaced apart from each other, and thus, lights, which are incident into the photoelectric conversion regions PD in the focus pixel region RP, may have different phases from each other. The focus of the image obtained may be corrected based on a difference in phase between images obtained by the photoelectric conversion regions PD.

In more detail, the focus of the image output from the pixel regions PX may be corrected by comparing a photoelectric signal output from the focus pixel region RP with a photoelectric signal output from the pixel regions PX. Accordingly, the image sensor may obtain 3D-depth information on a subject.

In an embodiment, although not shown, the focus pixel region RP may be configured to include three or more photoelectric conversion regions PD. In other words, the number of the photoelectric conversion regions PD disposed in the focus pixel region RP may be variously changed.

As an example, the color filter CF on the focus pixel region RP may include a white color filter or a transparent filter. As another example, the color filter CF on the focus pixel region RP may include a red filter, a green filter, or a blue filter, like the color filter CF on the pixel region PX.

Micro lenses may be disposed on the color filters CF, respectively. Each of the micro lenses may include the micro lens layer 500 and the lens coating layer 530. An auto-focus lens AFL may be provided on the focus pixel region RP.

Referring back to FIG. 5, the micro lenses of a first lens group GR1 may be two-dimensionally disposed to surround the auto-focus lens AFL. In an example embodiment, the first lens group GR1 may include 10 micro lenses, which directly surround the auto-focus lens AFL.

The auto-focus lens AFL may include a first edge ED1 and a second edge ED2 shorter than the first edge ED1. The second edge ED2 may be parallel to the second direction D2. The auto-focus lens AFL may further include a third edge ED3, which is opposite to the first edge ED1, and a fourth edge ED4, which is opposite to the second edge ED2.

For example, the first lens group GR1 may include a first micro lens ML1 adjacent to the first edge ED1, a second micro lens ML2 adjacent to the second edge ED2, a third micro lens ML3 adjacent to the third edge ED3, and a fourth micro lens ML4 adjacent to the fourth edge ED4. The first lens group GR1 may further include a fifth micro lens ML5 between the first and second micro lenses ML1 and ML2.

When viewed in a plan view, the first micro lens ML1, the second micro lens ML2 and the fifth micro lens ML5 therebetween may have different areas from each other. For example, the area of the fifth micro lens ML5 may be larger than the area of the second micro lens ML2, and the area of the first micro lens ML1 may be larger than the area of the fifth micro lens ML5.

The micro lenses (e.g., standard micro lenses (SML)) of a second lens group GR2 may be two-dimensionally disposed to surround the first lens group GR1. In an example embodiment, the second lens group GR2 may include 18 standard micro lenses SML, which directly surround the first lens group GR1. The standard micro lens SML may be a micro lens, which is disposed on the pixel region PX and has a standard size.

An area of the standard micro lens SML may be different from an area of each of the first, second, and fifth micro lenses ML1, ML2, and ML5 described above. In an embodiment, the area of the standard micro lens SML may be defined as a reference area of the micro lens. For example, the area of the first micro lens ML1 may be larger than the area of the standard micro lens SML (i.e., the reference area). The area of each of the second and fifth micro lenses ML2 and ML5 may be smaller than the area of the standard micro lens SML (i.e., the reference area).

Referring back to FIGS. 6A and 6B, the micro lens may have a trough TR that is defined between the micro lens and another micro lens adjacent thereto. Also, the micro lens may have a crest CR that is defined at the highest level of its top surface. A difference in level between the trough TR an d the crest CR of the micro lens may be defined as a height of the micro lens.

According to an example embodiment, the micro lenses may have different heights. If the height of the micro lens is increased, a light-receiving amount of the micro lens may be increased, and if the height of the micro lens is decreased, the light-receiving amount of the micro lens may be decreased.

The height of the micro lens may be proportional to its planar area. For example, in the case where the area of the first micro lens is larger than the area of the second micro lens, the height of the first micro lens may be larger than the height of the second micro lens.

In detail, the auto-focus lens AFL may have a first height HE1. Since the auto-focus lens AFL has the largest area among the micro lenses of FIG. 5, the first height HE1 may have a relatively large value.

Each of the standard micro lenses SML of the second lens group GR2 may have a third height HE3. The third height HE3 may be defined as a reference height of the micro lens. The first height HE1 may be larger than the third height HE3. In detail, a ratio of the first height HE1 to the third height HE3 may range from about 1.5 to about 5. In an embodiment, the ratio of the first height HE1 to the third height HE3 may range from about 1.5 to about 3.

The first micro lens ML1 of the first lens group GR1 may have a second height HE2. The second height HE2 may be larger than the third height HE3 and may be smaller than the first height HE1. For example, a ratio of the second height HE2 to the third height HE3 may range from about 1.1 to about 1.4. The height HE2 of the first micro lens ML1 may be increased by increasing an area of the first micro lens ML1. The light-receiving amount of the first micro lens ML1 may be increased by adjusting the second height HE2 of the first micro lens ML1 to a relatively large value.

A difference (i.e., HE2−HE3) between the second height HE2 of the first micro lens ML1 and the third height HE3, which is defined as the reference height, may be smaller than a difference (i.e., HE1−HE3) between the first height HE1 of the auto-focus lens AFL and the third height HE3 defined as the reference height.

The second micro lens ML2 of the second lens group GR2 may have a fourth height HE4. The fourth height HE4 may be smaller than the third height HE3. For example, a ratio of the fourth height HE4 to the third height HE3 may range from about 0.5 to about 0.9. The height HE4 of the second micro lens ML2 may be decreased by decreasing an area of the second micro lens ML2. The light-receiving amount of may be decreased by adjusting the fourth height HE4 of the second micro lens ML2 to a relatively small value.

A difference (i.e., HE3−HE4) between the fourth height HE4 of the second micro lens ML2 and the third height HE3, which is defined as the reference height, may be smaller than the difference (i.e., HE1−HE3) between the first height HE1 of the auto-focus lens AFL and the third height HE3, which is defined as the reference height. The difference (i.e., HE3−HE4) between the fourth height HE4 of the second micro lens ML2 and the third height HE3 defined as the reference height may be substantially equal to the difference (i.e., HE2−HE3) between the second height HE2 of the first micro lens ML1 and the third height HE3 defined as the reference height.

The auto-focus lens AFL may have a large size (e.g., a large height), compared with the standard micro lens SML. Since the height of the auto-focus lens AFL is larger than the height of each of the neighboring micro lenses (i.e., the first lens group GR1), the light-receiving amount in the first lens group GR1 adjacent thereto may be variously changed by the auto-focus lens AFL. For example, one of the micro lenses constituting the first lens group GR1 may have a light-receiving amount that is reduced compared to the standard micro lens SML, and another one of the micro lenses constituting the first lens group GR1 may have a light-receiving amount that is increased compared to the standard micro lens SML. In other words, the light-receiving amount of each of the micro lenses constituting the first lens group GR1 may be different from the light-receiving amount of the standard micro lens SML.

According to an example embodiment, by adjusting the height of the micro lens of the first lens group GR1, it may be possible to reduce a difference in light-receiving amount of the corresponding micro lens and the standard micro lens SML. For example, with respect to the first micro lens ML1 having a small light-receiving amount, by increasing its height, it may be possible to adjust its light-receiving amount to be the same light-receiving amount as the standard micro lens SML. With respect to the second micro lens ML2 having a large light-receiving amount, by decreasing its height, it may be possible to adjust its light-receiving amount to be the same light-receiving amount as the standard micro lens SML.

As a result, according to an example embodiment, by adjusting the physical height of the micro lens, it may be possible to compensate for a difference in a light amount between an optical signal in a pixel region PX adjacent to the focus pixel region RP and an optical signal in another pixel region PX spaced apart from the focus pixel region RP.

Figure 7:
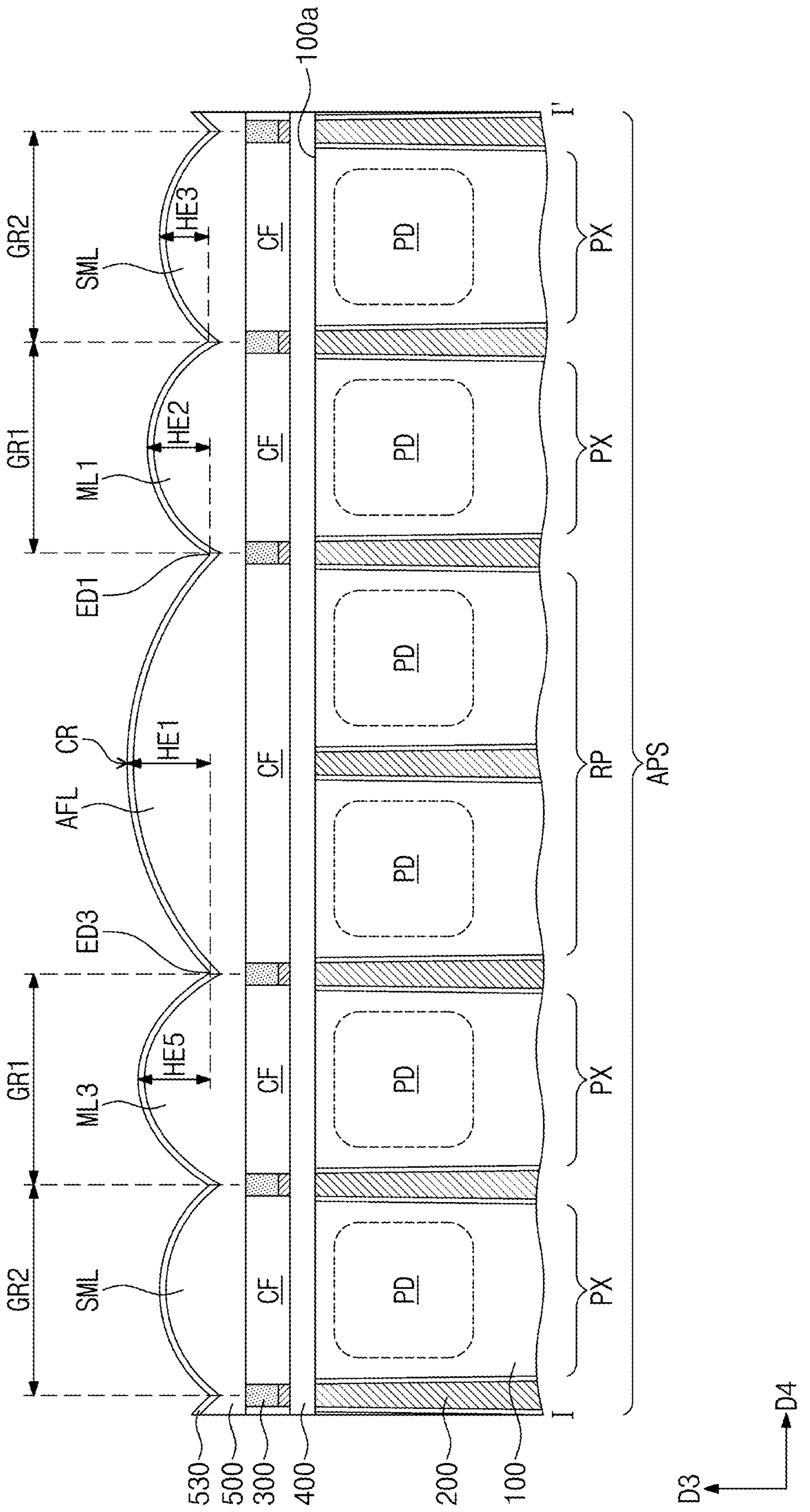
FIG. 7 is a sectional view, which is taken along the line I-I' of FIG. 5 to illustrate micro lenses according to an example embodiment.

FIG. 7 is a sectional view, which is taken along the line I-I' of FIG. 5 to illustrate the micro lenses according to an example embodiment. For concise description, an element previously described with reference to FIGS. 5, 6A, and 6B may be identified by the same reference number without repeating an overlapping description thereof.

Referring to FIGS. 5 and 7, the third micro lens ML3 of the first lens group GR1 may have a fifth height HE5. The fifth height HE5 may be larger than the second height HE2 and may be smaller than the first height HE1. For example, a ratio of the fifth height HE5 to the third height HE3 may range from about 1.3 to about 1.5. In other words, the first micro lens ML1 and the third micro lens ML3, which are provided adjacent to the first edge ED1 and the third edge ED3 of the auto-focus lens AFL that are opposite to each other, may have different heights from each other.

The difference (i.e., HE2−HE3) between the second height HE2 of the first micro lens ML1 and the third height HE3 defined as the reference height may be smaller than a difference (i.e., HE5−HE3) between the fifth height HE5 of the third micro lens ML3 and the third height HE3 defined as the reference height.

Figure 8:
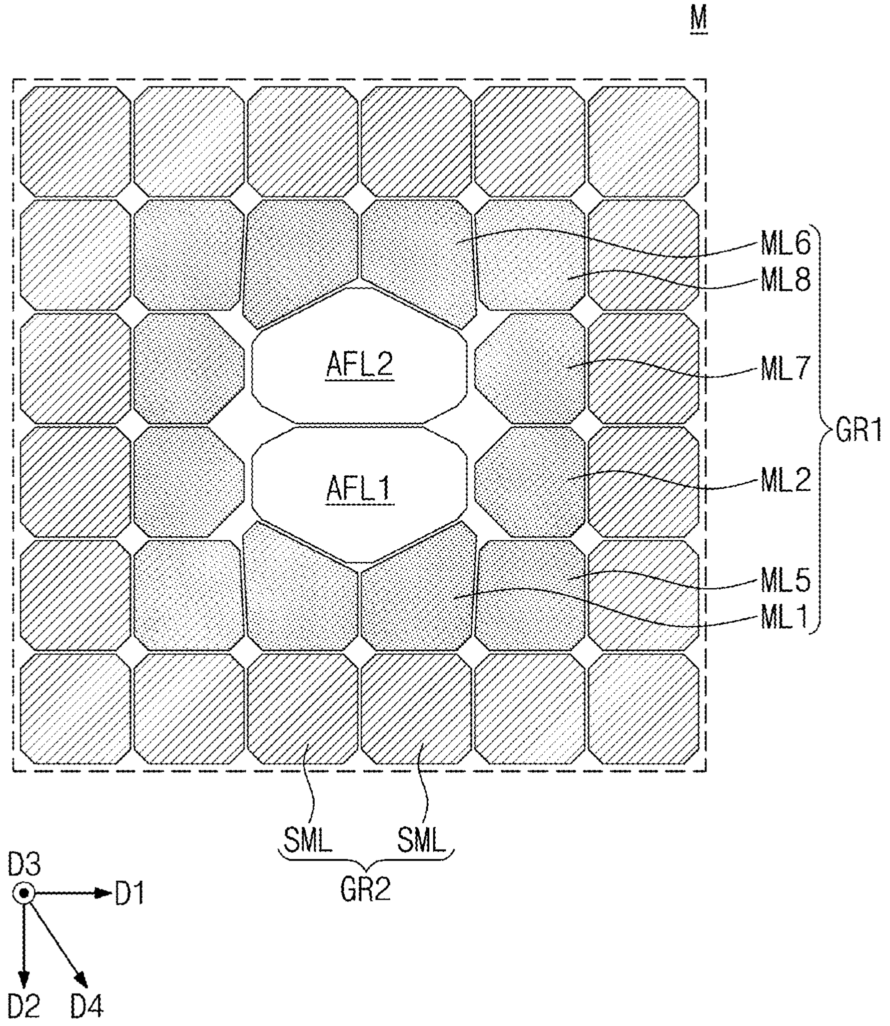
FIG. 8 is a plan view illustrating a portion (e.g., the portion M of FIG. 2) of micro lenses according to an example embodiment.

FIG. 8 is a plan view illustrating a portion (e.g., the portion M of FIG. 2) of the micro lenses according to an example embodiment. For concise description, an element previously described with reference to FIGS. 5, 6A, and 6B may be identified by the same reference number without repeating an overlapping description thereof.

Referring to FIG. 8, a first auto-focus lens AFL1 and a second auto-focus lens AFL2 may be provided. The first and second auto-focus lenses AFL1 and AFL2 may be adjacent to each other in the second direction D2. The micro lenses of the first lens group GR1 may be two-dimensionally disposed to surround the first and second auto-focus lenses AFL1 and AFL2.

For example, the first lens group GR1 may include the first and second micro lenses ML1 and ML2 adjacent to the first auto-focus lens AFL1. The first lens group GR1 may further include the fifth micro lens ML5 between the first and second micro lenses ML1 and ML2. The first lens group GR1 may include sixth and seventh micro lenses ML6 and ML7 adjacent to the second auto-focus lens AFL2. The first lens group GR1 may further include an eighth micro lens ML8 between the sixth and seventh micro lenses ML6 and ML7.

The first micro lens ML1 may have substantially the same area and height as the sixth micro lens ML6. The second micro lens ML2 may have substantially the same area and height as the seventh micro lens ML7. The fifth micro lens ML5 may have substantially the same area and height as the eighth micro lens ML8.

The micro lenses (i.e., the standard micro lenses SML) of the second lens group GR2 may be two-dimensionally disposed to surround the first lens group GR1.

Figure 9:
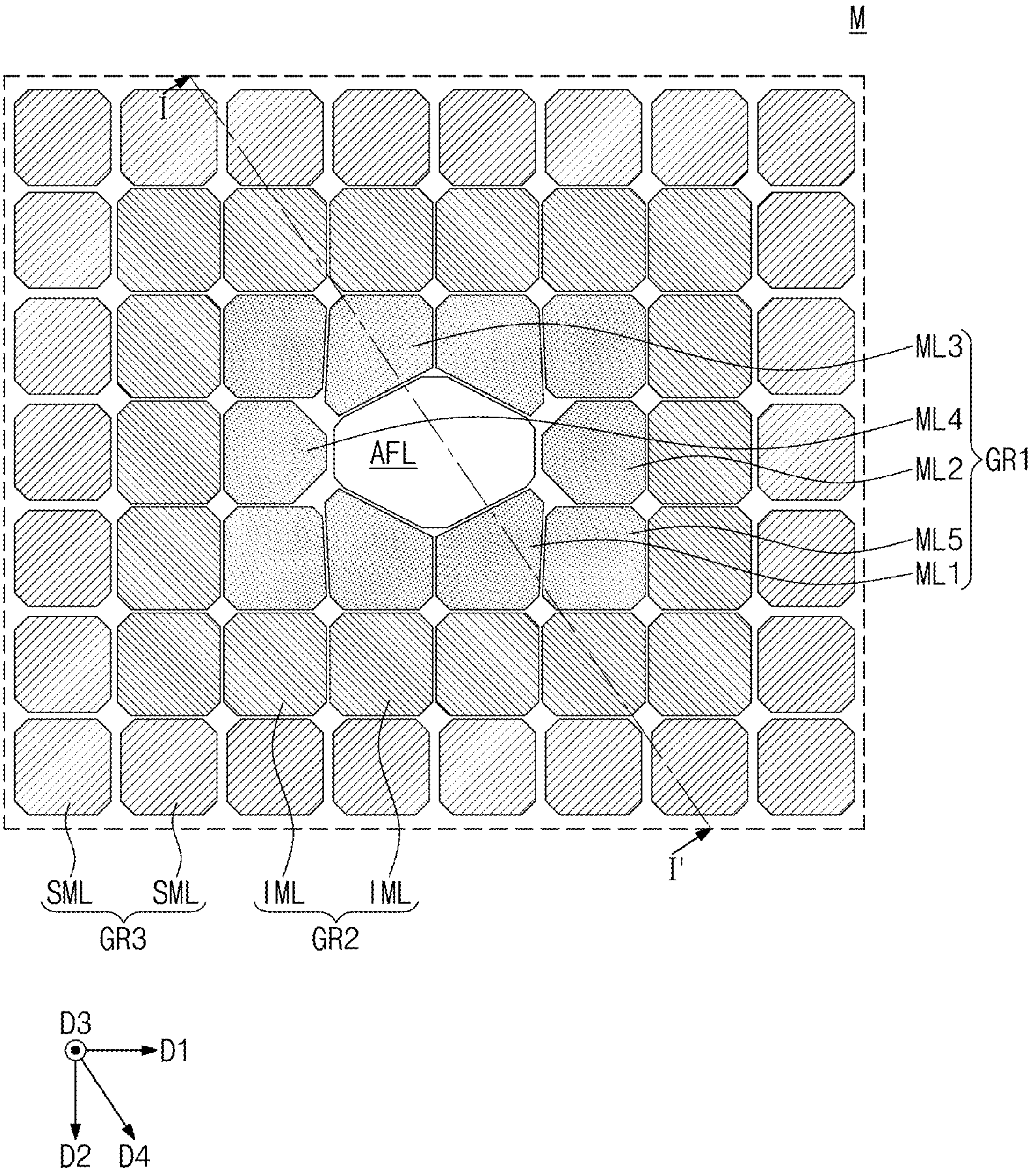
FIG. 9 is a plan view illustrating a portion (e.g., the portion M of FIG. 2) of micro lenses according to an example embodiment.
Figure 10:
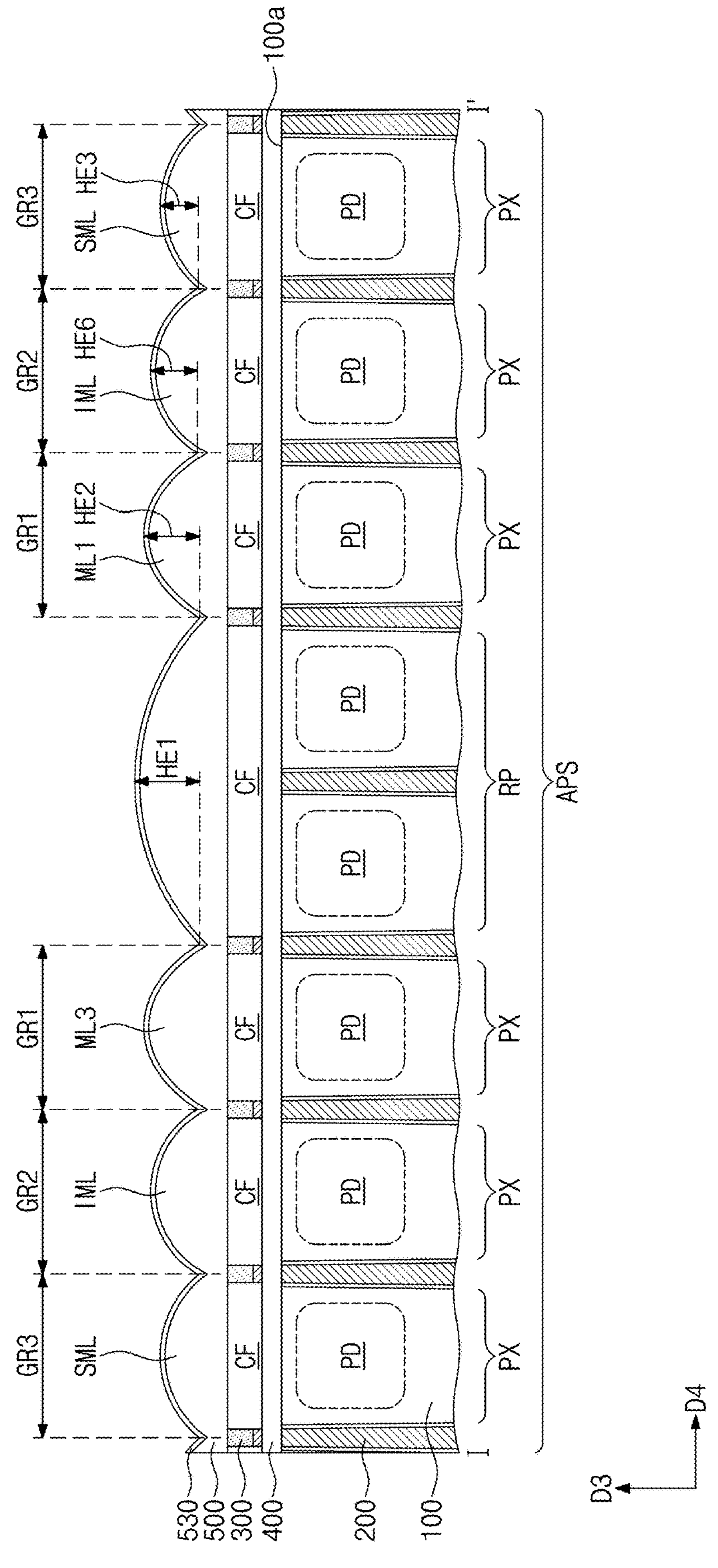
FIG. 10 is a sectional view taken along a line I-I' of FIG. 9.

FIG. 9 is a plan view illustrating a portion (e.g., the portion M of FIG. 2) of the micro lenses according to an example embodiment. FIG. 10 is a sectional view taken along a line I-I' of FIG. 9. For concise description, an element previously described with reference to FIGS. 5, 6A, and 6B may be identified by the same reference number without repeating an overlapping description thereof.

Referring to FIGS. 9 and 10, the auto-focus lens AFL and the micro lenses of the first lens group GR1 surrounding the auto-focus lens AFL may be provided. In addition, the micro lenses of the second lens group GR2 may be provided to surround the first lens group GR1. In an example embodiment, the second lens group GR2 may include non-standard micro lenses IML. A third lens group GR3, which includes the standard micro lenses SML, may be provided to surround the second lens group GR2.

The non-standard micro lens IML may have an area and a height that are different from the reference area and the reference height of the standard micro lens SML. For example, the non-standard micro lens IML may have an area, which is larger than the reference area, and a height, which is larger than the reference height. As shown in FIG. 10, the non-standard micro lens IML may have a sixth height HE6. The sixth height HE6 may be larger than the third height HE3, which is defined as the standard height, and may be smaller than the second height HE2. A ratio of the sixth height HE6 to the third height HE3 may range from about 1.1 to about 1.3.

The auto-focus lens AFL may cause a change in the light-receiving amount of not only the first lens group GR1 directly adjacent to the auto-focus lens AFL but also the second lens group GR2. Here, the term "directly adjacent" may mean that a micro lens in the first lens group GR1 is adjacent to the auto-focus lens AFL without any intervening micro lens therebetween (e.g., ML5 in the first lens group GR1). According to an example embodiment, since the non-standard micro lenses IML, not the standard micro lenses SML, are provided in the second lens group GR2, it may be possible to compensate for the change of the light-receiving amount.

For example, the change of the light-receiving amount in the first micro lens ML1 constituting the first lens group GR1 may be greater than the change of the light-receiving amount in the non-standard micro lens IML constituting the second lens group GR2. This is because a distance between the auto-focus lens AFL and the first lens group GR1 is smaller than a distance between the auto-focus lens AFL and the second lens group GR2.

The difference (i.e., HE2–HE3) between the height of the first micro lens ML1 and the reference height may be selected to have a larger value than a difference (i.e., HE6–HE3) between the height of the non-standard micro lens IML and the reference height. Accordingly, it may be possible to appropriately compensate for the change of the light-receiving amount, depending on a distance from the auto-focus lens AFL.

To sum up, as shown in FIG. 10, the height of the micro lens may be adjusted in such a way that a difference between the height of the micro lens and the reference height is reduced as a distance from the auto-focus lens AFL in a fourth direction D4 is increased.

Figure 11:
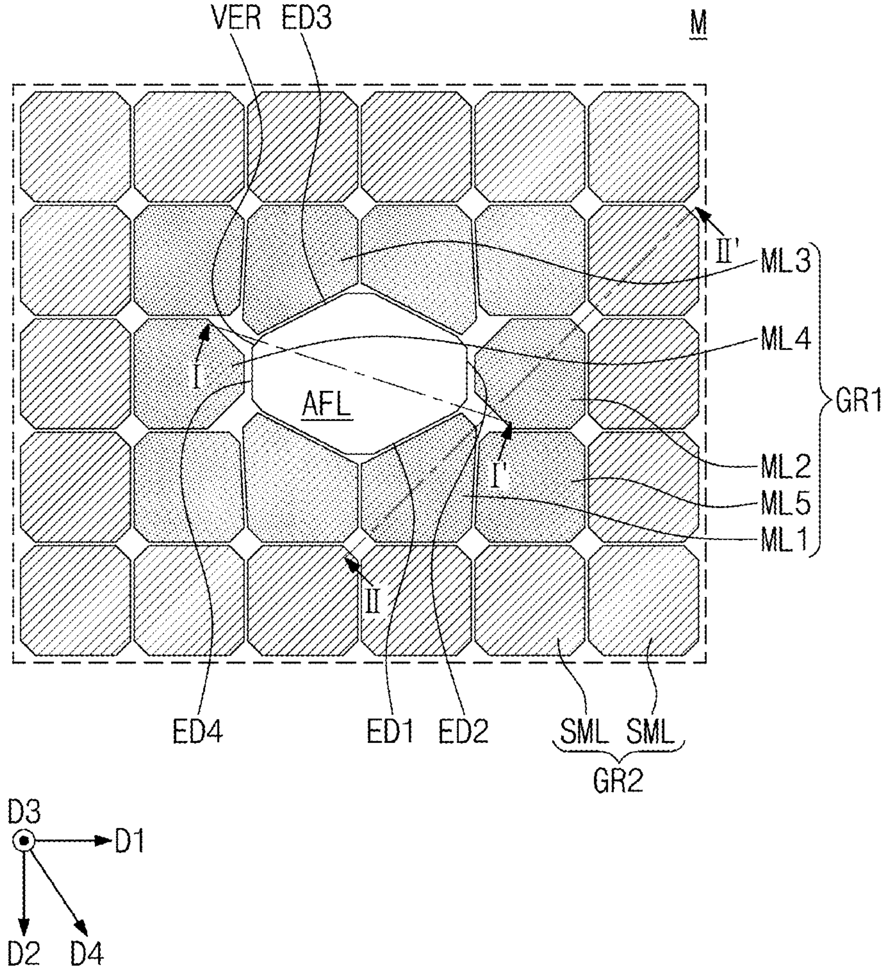
FIG. 11 is a plan view illustrating the micro lenses of FIG. 5.
Figure 12A:
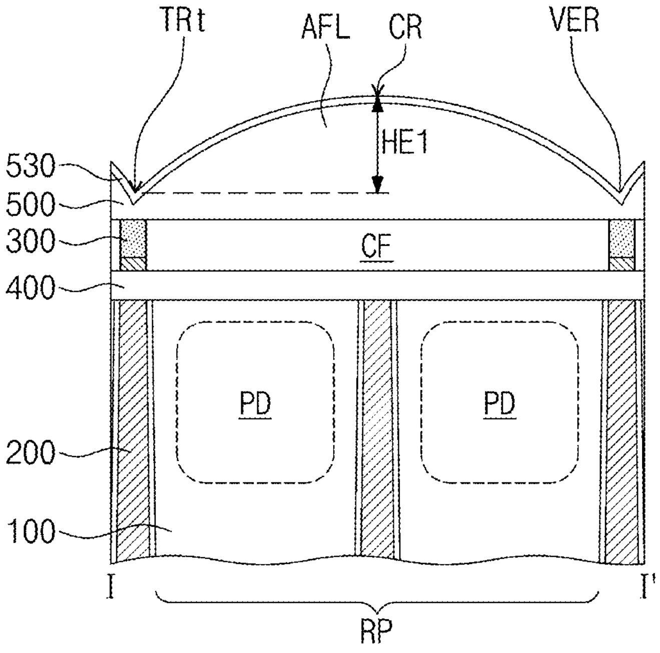
FIG. 12A is a sectional view taken along a line I-I' of FIG. 11.
Figure 12B:
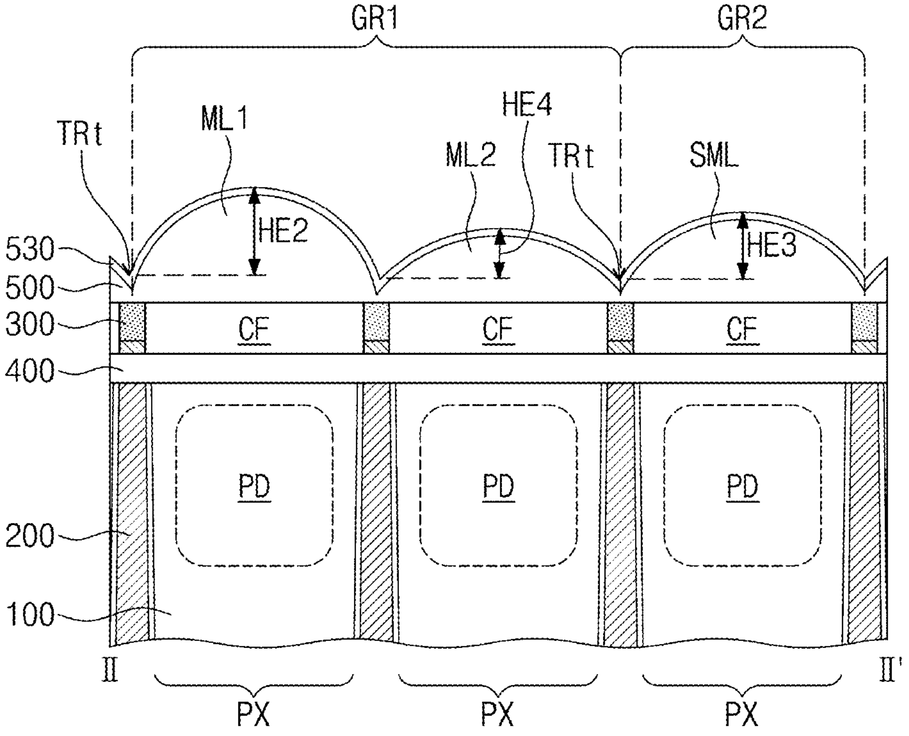
FIG. 12B is a sectional view taken along a line II-II' of FIG. 11.

FIG. 11 is a plan view illustrating the micro lenses of FIG. 5. FIG. 12A is a sectional view taken along a line I-I' of FIG. 11. FIG. 12B is a sectional view taken along a line II-II' of FIG. 11. For concise description, an element previously described with reference to FIGS. 5, 6A, and 6B may be identified by the same reference number without repeating an overlapping description thereof.

Referring to FIGS. 11, 12A, and 12B, the height of the micro lens may be defined as a difference in level between the lowermost one of the troughs TRt and the crest CR. The lowermost trough TRt of the micro lens may be located at a corner where two adjacent edges of the micro lens meet.

In detail, the lowermost trough TRt of the auto-focus lens AFL may be located at a corner VER where the first and second edges ED1 and ED2 meet. The lowermost trough TRt illustrated in FIG. 12A may be lower than the trough TR illustrated in FIG. 6A. The first height HE1 of the auto-focus lens AFL may be a difference in level between the lowermost trough TRt and the crest CR in the auto-focus lens AFL.

The first micro lens ML1 may have the lowermost trough TRt at one of its corners. The second height HE2 of the first micro lens ML1 may be a difference in level between the lowermost trough TRt and the crest CR in the first micro lens ML1. The second micro lens ML2 may have the lowermost trough TRt at one of its corners. The fourth height HE4 of the second micro lens ML2 may be a difference in level between the lowermost trough TRt and the crest CR in the second micro lens ML2. The standard micro lens SML may have the lowermost trough TRt at one of its corners. The third height HE3 of the standard micro lens SML may be a difference in level between the lowermost trough TRt and the crest CR in the standard micro lens SML.

According to example embodiments of the disclosure, a height of a micro lens near an auto-focus lens may be adjusted. The presence of the auto-focus lens may affect a light-receiving amount of the micro lens, but the adjusting of the height of the micro lens may allow for a desired light-receiving amount of the micro lens. In other words, by adjusting the height of the micro lens near the auto-focus lens, it may be possible to compensate for a change in light-receiving amount of the micro lens caused by the auto-focus lens. Accordingly, an image quality of an image sensor may be improved.

While example embodiments of the disclosure have been particularly shown and described, it will be understood by one of ordinary skill in the art that variations in form and detail may be made therein without departing from the spirit and scope of the attached claims.

What is claimed is:

1. An image sensor comprising:

a first substrate including a focus pixel region and pixel regions around the focus pixel region, each of the focus pixel region and the pixel regions around the focus pixel region comprising at least one photoelectric conversion region;

color filters provided on the focus pixel region and the pixel regions, respectively, and provided on a first surface of the first substrate; and micro lenses provided on the color filters, respectively, wherein the micro lenses comprise:

an auto-focus lens on the focus pixel region;

a first micro lens adjacent to a first edge of the auto-focus lens;

a second micro lens adjacent to a second edge of the auto-focus lens; and a standard micro lens spaced apart from the auto-focus lens;

wherein the auto-focus lens has a first height, the first micro lens has a second height, the standard micro lens has a third height, and the second micro lens has a fourth height; and wherein the first height, the second height, the third height, and the fourth height are different from each other.

2. The image sensor of claim 1, wherein among the first to fourth heights, the first height is the greatest.

3. The image sensor of claim 1, wherein a length of the first edge is greater than a length of the second edge, and wherein the second height is greater than the fourth height.

4. The image sensor of claim 3, wherein a ratio of the second height to the third height ranges from 1.1 to 1.4.

5. The image sensor of claim 3, wherein a ratio of the fourth height to the third height ranges from 0.5 to 0.9.

6. The image sensor of claim 1, wherein, when viewed in a planar view, an area of the auto-focus lens, an area of the first micro lens, an area of the second micro lens, and an area of the standard micro lens are different from each other.

7. The image sensor of claim 6, wherein a length of the first edge is greater than a length of the second edge, and wherein the area of the first micro lens is greater than the area of the second micro lens.

8. The image sensor of claim 1, further comprising:
an isolation pattern provided in the first substrate to define the focus pixel region and the pixel regions around the focus pixel region;
transistors provided on a second surface of the first substrate, the second surface being opposite to the first surface;
a first interconnection layer on the second surface;
a second substrate; and
a second interconnection layer on the second substrate;
wherein the first interconnection layer and the second interconnection layer are vertically stacked and electrically connected to each other.

9. The image sensor of claim 8, further comprising:
a penetration hole penetrating the first substrate and exposing the first interconnection layer and the second interconnection layer; and
a conductive pattern provided in the penetration hole.

10. The image sensor of claim 8, wherein:
the first interconnection layer comprises a first connection pad;
the second interconnection layer comprises a second connection pad; and
the first connection pad and the second connection pad are vertically aligned to each other and in contact with each other.

11. An image sensor comprising:
a substrate including a focus pixel region and pixel regions around the focus pixel region, each of the focus pixel region and the pixel regions around the focus pixel region comprising at least one photoelectric conversion region;
color filters provided on the focus pixel region and the pixel regions around the focus pixel region, respectively; and
micro lenses provided on the color filters, respectively, wherein the micro lenses comprise:
an auto-focus lens on the focus pixel region;
a first micro lens adjacent to a first edge of the auto-focus lens;
a second micro lens adjacent to a second edge of the auto-focus lens; and
a standard micro lens spaced apart from the auto-focus lens;
wherein, when viewed in a planar view, an area of the first micro lens, an area of the second micro lens, and an area of the standard micro lens are different from each other.

12. The image sensor of claim 11, wherein a length of the first edge is greater than a length of the second edge, and wherein the area of the first micro lens is greater than the area of the second micro lens.

13. The image sensor of claim 12, wherein a height of the first micro lens is greater than a height of the second micro lens.

14. The image sensor of claim 12, wherein the area of the first micro lens is greater than the area of the standard micro lens, and wherein the area of the second micro lens is smaller than the area of the standard micro lens.

15. The image sensor of claim 11, wherein, when viewed in a planar view, the first micro lens has a first shape, the second micro lens has a second shape, and the standard micro lens has a third shape, and wherein the first shape, the second shape, and the third shape are different from each other.

16. The image sensor of claim 11, wherein the first micro lens, the second micro lens, and the standard micro lens overlap with the pixel regions around the focus pixel region, respectively.

* * * * *